US 7,095,354 B2

(12) United States Patent
Harrison et al.

(10) Patent No.: US 7,095,354 B2
(45) Date of Patent: Aug. 22, 2006

(54) VERY LINEAR WIDE-RANGE PIPELINED CHARGE-TO-DIGITAL CONVERTER

(75) Inventors: Daniel David Harrison, Delanson, NY (US); Naresh Kesavan Rao, Clifton Park, NY (US); Shobhana Mani, Clifton Park, NY (US); Naveen Stephan Chandra, Kenosha, WI (US); Oliver Richard Astley, Clifton Park, NY (US); Donald Thomas McGrath, Fort Collins, CO (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/203,493

(22) Filed: Aug. 12, 2005

(65) Prior Publication Data

US 2006/0038712 A1    Feb. 23, 2006

Related U.S. Application Data

(60) Provisional application No. 60/601,684, filed on Aug. 12, 2004.

(51) Int. Cl.
*H03M 1/36*    (2006.01)
(52) U.S. Cl. ........................... 341/159; 341/155
(58) Field of Classification Search ................ 341/155, 341/172, 159, 161, 162
See application file for complete search history.

(56) References Cited

U.S. PATENT DOCUMENTS

| | | | | |
|---|---|---|---|---|
| 3,703,002 A | | 11/1972 | Van Saun | 341/162 |
| 4,144,527 A | | 3/1979 | Butler et al. | 340/347 |
| 4,965,578 A | | 10/1990 | Poujois | 341/157 |
| 5,101,206 A | | 3/1992 | Riedel | 341/156 |
| 5,117,227 A | | 5/1992 | Goeke | 341/156 |
| 5,126,743 A | | 6/1992 | Hobbs | 341/157 |
| 5,262,779 A | | 11/1993 | Sauer | 341/161 |
| 5,329,281 A | * | 7/1994 | Baumgartner et al. | 341/139 |
| 5,579,007 A | * | 11/1996 | Paul | 341/172 |
| 5,638,072 A | * | 6/1997 | Van Auken et al. | 341/141 |
| 5,748,134 A | | 5/1998 | Dent | 341/172 |
| 6,366,231 B1 | | 4/2002 | Rao et al. | 341/166 |
| 2005/0280565 A1 | * | 12/2005 | Kushner et al. | 341/120 |

* cited by examiner

*Primary Examiner*—Peguy JeanPierre
(74) *Attorney, Agent, or Firm*—Jean K. Testa; Donald S. Ingraham

(57) ABSTRACT

A multi-channel analog to digital conversion circuit and methods thereon are provided. The multi-channel analog to digital conversion cirucit comprises a plurality of linearized channels wherein each channel comprises a multi-stage pipelined charge-to-digital converter and an integrating capacitor within each stage of the multi-stage converter wherein analog residue is processed by subsequent analog to digital converter stages. Each stage of respective linearized channels is configured for calculating gain and offset for each stage in the channel and such gain and offset is used in subsequent integration periods.

24 Claims, 28 Drawing Sheets

MS = Measurement Signal

FIG. 24  MS = Measurement Signal

MS = Measurement Signal

VERY LINEAR WIDE-RANGE PIPELINED CHARGE-TO-DIGITAL CONVERTER

CROSS-REFERENCE TO RELATED APPLICATIONS

This application claims the benefit of U.S. Provisional Application No. 60/601,684, filed on Aug. 12, 2004.

BACKGROUND OF THE INVENTION

The present invention relates generally to a charge-to-digital converter for use in a charge sensor system.

This invention is related to U.S. Pat. No. 6,366,231, "Integrate and fold analog-to-digital converter with saturation prevention" that describes a Charge-to-Digital (C/D) converter wherein the contents are incorporated by reference herein. That C/D converter performs analog to digital conversion by removing a fixed-size "teaspoon" of charge from the integration capacitor whenever the capacitor (and associated amplifier) get too full (the teaspoon-charge removal is also called a "fold"). The removed charge is discarded so as to allow room for further charge integration, but the removal is tallied. At the end of the integration period, the integer tally is noted and represents the most-significant part of the digital representation of the integrated charge. There is also a remainder charge that was insufficient for another tally. In the pipeline form, or alternatively multistage analog-to-digital converter, this remainder charge is amplified and applied to a second stage of integration, teaspooning (folding), and tallying so as to identify further significant digital bits. The second stage has yet another remainder charge that is then again processed by a third stage, and subsequent charges. The final result is a set of tally results from N (e.g., 4) stages of Integrate and Fold Amplification. The remainder charge in the last stage (of the pipeline) is an insignificant part of the total charge for the initial stage-1 integration period and is ignored.

The present invention relates to the practical aspects of making a pipelined Integrate and Fold based C/D converter that is very linear, has a wide input-charge dynamic range, and will function properly when packed with many other similar C/D converters (e.g., 64) and the associated digital-control logic on the same Integrated-Circuit (IC) die.

To aide in the description of the invention, the Integrate and Fold Amplifier (IFA) stage is cast as either a "current processing" or a "voltage processing" IFA stage (CPIFA or VPIFA, respectively). The current-processing stage is connected to the charge (current) source. The voltage-processing stage processes the residual charge (voltage) from a prior stage. FIG. 1 shows a schematic for the current-process stage and FIG. 2 shows the schematic for that voltage-processing stage. FIG. 3 shows how the two kinds of stages are combined in a pipeline to form a 4-stage C/D converter channel. In FIG. 3, see each stage generates a Fold count (the teaspoon tally) and a residual charge (or representative voltage) as output. The residual charge is passed to the next stage for further processing.

FIG. 1 shows the CPIFA 100 stage with switch positions set for normal integration. Current flows from the sensor 110 through switch $S_d$ 120 into integration (feedback) capacitor $C_{f1}$ 130. Sensor 110 is typically one of an array of sensors on a common integrated-circuit substrate. Resistor $R_d$ 140 represents the sensor self-leakage resistance, and resistors $R_{a1}$ 150 through $R_{aK}$ 160 represent the between-sensor leakage resistances to K other sensors. The resistance values are usually very high, but their effect often cannot be ignored.

As charge accrues on feedback Cup 130 $C_{f1}$, stage-1 output voltage $V_{out1}$ 170 becomes proportionally more negative. With positive current, $V_{out1}$ 170 eventually becomes more negative than threshold voltage $V_{th1}$ 180 so that comparator 190 trips and requests a "fold" from the Fold Processor 210 in the Digital Control bloc 200. When appropriate, the Fold Processor 210 responds with an accurately timed fold pulse that switches fold switch 220 thus removing Fold Current $I_{fold1}$ 230 from the integration capacitor for the pulse duration. Over an integration period, multiple fold requests and folds may occur and the number of folds is counted for that integration period. At the end of the integration period, after all folding is completed, a residual charge remains on integration capacitor 130 and it is proportionally represented by $V_{out1}$ 170 at the Analog Residual output 240. This voltage can be processed by the voltage-processing IFA stage 200 of FIG. 2 (or by conventional analog-to-digital conversion means) to extract more digital resolution of the total integrated charge.

At the end of each integration period, after the Analog Residual output 240 has been sampled by a following stage (not shown) or by an A/D converter (not shown), the stage-1 IFA can be reset so that the Analog Residual value starts at zero for each integration period. This is the "resetting mode" of CPIFA operation. Alternatively, this reset can be eliminated, but then the stage-1 Fold Count and the change in stage-1 Analog Residual together indicate the total integrated charge. This is the "no-resetting" mode of CPIFA operation.

Referring further to FIG. 1, in the resetting mode, before each integration period begins, reset switch $S_{r1}$ 250 is closed and auto-zero switch $S_{az1}$ 260 is connected to ground. This eliminates the prior residual charge from integration capacitor $C_{f1}$ 130 and samples the small but typically non-zero input-offset voltage of imperfect amplifier $A_1$ 270 onto $C_{f1}$ 130 and onto the parasitic sensor and interconnection capacitance, $C_d$ 280. This makes the stage-1 analog residual value be zero when the total input charge is zero. During the reset period, current is not integrated by $C_{f1}$ 130 and any charge source during this time is wasted. It is advantageous to minimize wasted charge source.

In the no-resetting mode, current is continually integrated. Charge is not wasted. Also, reset switch 250 is not closed and auto-zero switch 260 is not connected to ground. This has the advantage that inherent noise from amplifier 270 is not sampled onto $C_{f1}$ 130 and $C_d$ 280 as is done at the end of the reset period in the resetting mode of operation. It is advantageous to reduce any noise contributed to the integrated charge.

FIG. 2 shows the voltage-processing IFA (VPIFA) stage 300. In practice, the Input Voltage node is connected directly to the Analog Residual node (240-FIG. 1) of a preceding CPIFA or VPIFA stage (but it can also be connected directly to a voltage that is to be measured, not necessarily from a sensor). The VPIFA operates by first sampling the input voltage onto sample capacitor $C_{s2}$ 310 as a stored charge, and then measuring the stored charge in a manner similar to the way a CPIFA measures integrated current. The sampling process consists of setting auto-zero switch $S_{az2}$ 320 to ground, closing reset switch $S_{r2}$ 330, and closing sample switch 340. During this time, discharge switch $S_{dis2}$ 350, bypass switch $S_{byp2}$ 360 and fold switch $S_{f2}$ 370 are all open. This samples the amplifier input-offset voltage onto $C_{f2}$ 380, and the input voltage (minus the input-offset voltage) onto $C_{s2}$ 310. This sampling method reduces/eliminates the effect of a non-zero amplifier input-offset voltage.

After sampling, the charge stored on sample capacitor $C_{s2}$ 310 is measured by opening reset switch $S_{r2}$ 330, setting auto-zero switch $S_{az2}$ 320 to the downward position, and closing discharge switch $S_{dis2}$ 350. Charge then flows from $C_{s2}$ 310 to $C_{f2}$ 380, and $V_{out2}$ 390 goes more negative. If there is sufficient sampled charge, comparator $Comp_2$ 400 eventually trips and requests a fold. The Fold Processor 410 then generates a fold pulse and $V_{out2}$ 390 is taken more positive. This is similar to operation of the CPIFA 100 (FIG. 1).

FIG. 3 shows a pipeline consisting of 3 VPIFA stages 300 following a CPIFA 100. Each stage emits a fold count associated with the input charge, and the size of a fold in each stage must be determined (calibrated) in order to determine the stage-1 input-referred charge value associated with the set of fold counts. For linear operation, the fold sizes must not change in an unknown manner between fold-size calibrations. Therefore, it is advantageous to have an IFA-based C/D converter whose fold-sizes are independent of the signal levels in the pipeline.

The sampling process between pipeline stages must be very accurate if high linearity is to be achieved. (Therefore, it's advantageous to have an IFA-based C/D converter with very high sampling accuracy between stages.)

Finally, multiple C/D converter channels (not shown) may be included on the same integrated circuit (IC) along with the associated digital control logic. Digital circuits and analog-switch commands both produce digital noise. Therefore, it is advantageous for a wide-range C/D converter (one that operates at very small signal levels) to be made insensitive to any digital noise and/or be able to ignore noise that occurs at predictable times.

In FIG. 1, the sensor leakage resistances $R_a$ 140 are not infinite, and the amplifier input-offset voltage 290 is not zero. This means that there will be a leakage-current contribution to the input current, and the sign and magnitude of the leakage will depend on the relative signs and magnitudes of the input voltages of the CPIFA of the different channels. If the input voltage of one channel were to go very far positive or negative, that channel would corrupt the integration results for other channels by adding substantial interchannel leakage via resistors $R_{a1}$ 150 through $R_{aK}$ 160. Therefore, it is advantageous to insure that the input of each channel will remain near zero volts under all input conditions (for example, even when the CPIFA is overloaded or saturated by an input current that is too large).

What is needed is multi-channel analog to digital conversion circuit that overcomes the challenges described above. Some aspects apply only to a pipelined IFA channel (more than one stage) while others apply only to the current-processing IFA stage.

BRIEF SUMMARY OF THE INVENTION

A linear wide-range pipelined Charge-to-Digital converter is provided comprising over-range channel-to-channel crosstalk prevention, inter-stage sampling error reduction, reduced voltage processing stages, and fold size enhancements. A multi-channel analog to digital conversion circuit and methods thereon are provided. The multi-channel analog to digital conversion cirucit comprises a plurality of linearized channels wherein each channel comprises a multi-stage pipelined charge-to-digital converter and an integrating capacitor within each stage of the multi-stage converter. Each stage of respective linearized channels is configured for calculating gain and offset for each stage in the channel and such gain and offset is used in subsequent integration periods.

DETAILED DESCRIPTION OF THE INVENTION

In a first embodiment, over-range channel-to-channel crosstalk prevention is provided as follows: Keep sensor near ground potential so no "crosstalk" in sensor array or interconnects (flex); Comparator to detect out-of-bounds stage-1 integrator voltage; and, Latching of stage 1 into reset (cap shorted), or connecting sensor to ground.

Figure 4:
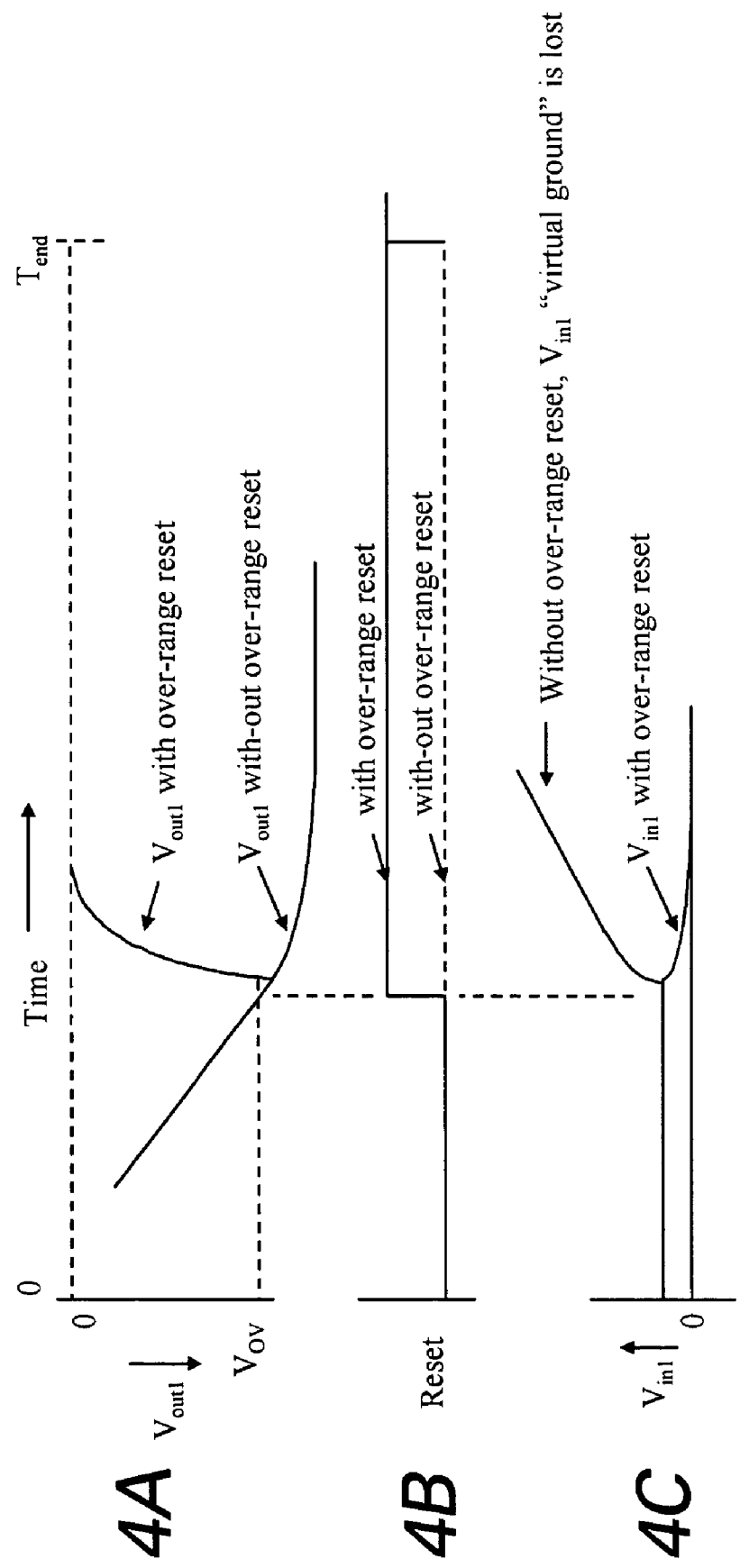
FIG. 4 is a graphical illustration of embodiments of crosstalk prevention circuits to which embodiments of the present invention are applicable.

Referring again to FIG. 1, and also to FIG. 4. As input current flows into integration capacitor 130, amplifier 270 operates to make Vout1 170 more negative so as to keep the difference between its positive and negative inputs very near zero. This is shown in FIG. 4A. Since its positive input is connected to ground, amplifier A1 270 works to maintain a virtual ground on its negative input 290 (Vin1). The amplifier has a non-zero time delay from input to output and, as is well known, this causes the input voltage at the inverting input to be approximately proportional to the input current, with a small proportionality coefficient (e.g., 1 mV/uA). This non-zero voltage is shown in FIG. 4C, where its assumed that the input current is constant. If the input current is too large, the Fold Processor and Fold Current source 105 will not be able to fold often enough to keep Vout1 170 within the normal integrator operating range. Vout1 170 will eventually saturate at some negative voltage value and amplifier 270 will no longer maintain the virtual ground on its negative input. This is shown in FIGS. 4A and 4C. Further input current will force Vin1 290 and the sensor input node to go positive. Note that this will corrupt the charge measurement from the over-ranging channel. Also, due to the unavoidable inter-sensor leakage resistances Ra1 150 through RaK 160, elevated sensor voltage will corrupt the charge measurements of channels associated with other sensors. The corruption of other channels can be avoided by preventing Vin1 290 from deviating far from its nominal zero voltage value.

One way to keep $V_{in1}$ 290 near zero volts is to monitor $V_{in1}$ 290 with a comparator (not shown) and set sensor switch $S_d$ 120 to ground if $V_{in1}$ goes too far positive. However, this monitoring method gives no advanced warning that loss of virtual ground is about to occur, and this means that some deviation of $V_{in1}$ will occur before any corrective action is taken. An exemplary method instead monitors stage 1 o/p $V_{out1}$ 170. When folding doesn't occur, $V_{out1}$ grows continuously more negative as input current is integrated but then saturates (reaches a limit) when virtual ground is lost. As used herein the term "folding" refers to the process of removing charge from the integrating capacitor 130. An "out-of-bound" threshold for $V_{out1}$ 170 can be chosen that is discernibly more negative than the "normal" most-negative $V_{out1}$ 170 value (i.e., when folding occurs in a timely manner), but is still within the range that allows $A_1$ to maintain its virtual ground. Note that these over-range prevention methods don't prevent corruption of charge measurement in channels that go out-of-bounds.

Figure 1:
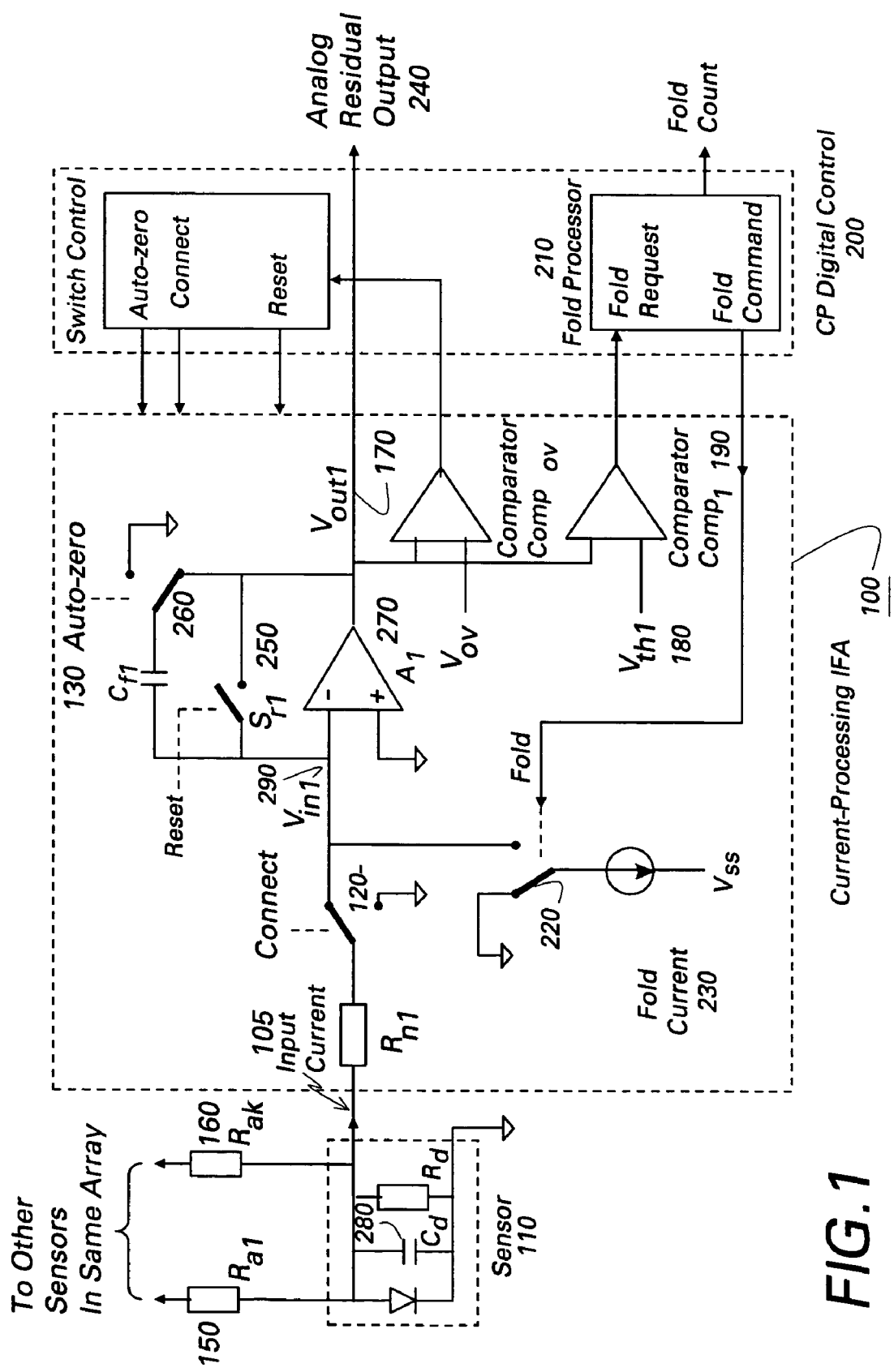
FIG. 1 is a systematic of a current processing integrate and fold amplifier stage (CPIFA) to which embodiments of the present invention are applicable.

Referring to FIG. 1, an embodiment for a over-range crosstalk prevention circuit does the following:

Step 1) Sets a threshold voltage $V_{OV}$ for $V_{out1}$ 170 that is out-of-bounds in the negative direction, but that is within the linear operating range of amplifier 270 (where virtual ground is maintained);

Step 2) Detects that $V_{out1}$ 179 has gone more-negative than threshold voltage $V_{OV}$;

Step 3) Closes reset switch $S_{r1}$ 250 when (or soon after) out-of-bounds is detected This dumps the integrated charge from $C_{f1}$ 130 and takes $V_{out1}$ 170 back to nearly zero volts, thus preventing over-range from occurring; or Step 4) Optionally holds reset switch $S_{r1}$ 250 closed for the remainder of the integration period (latched reset) once out-of-bounds is detected. This is shown in FIGS. 4A, 4B, and 4C. If latched reset is not used, $V_{out1}$ will cycle back and forth across $V_{OV}$ as long as the input current is too large; or Step 5) Optionally sets an out-of-bounds indicator if out-of-bounds was detected during the integration period. This indicator is reset at the beginning of each integration period. It allows the user to identify channels and integration periods whose charge measurements were corrupted by the over-range crosstalk protection process.

An alternative embodiment employees a dynamic control of reset switch $S_{r1}$ 250. In this embodiment, steps 1 and 2 above are performed, but step 3 is modified by setting sensor switch $S_d$ 120 to ground (instead of, or in concert with closing reset switch $S_{r1}$ 250). In this method, steps 4 and 5 are again optional.

In an exemplary embodiment, the method described above is used and a reset latch is included. Furthermore, a separate comparator is used for out-of-bounds detection. Alternatively, one could "timeshare" a single comparator to detect both $V_{th1}$ and $V_{OV}$ threshold crossings by $V_{out1}$. Using a single comparator saves IC die area and consumes less power than using two comparators, but the digital control is more complicated.

Figure 5:
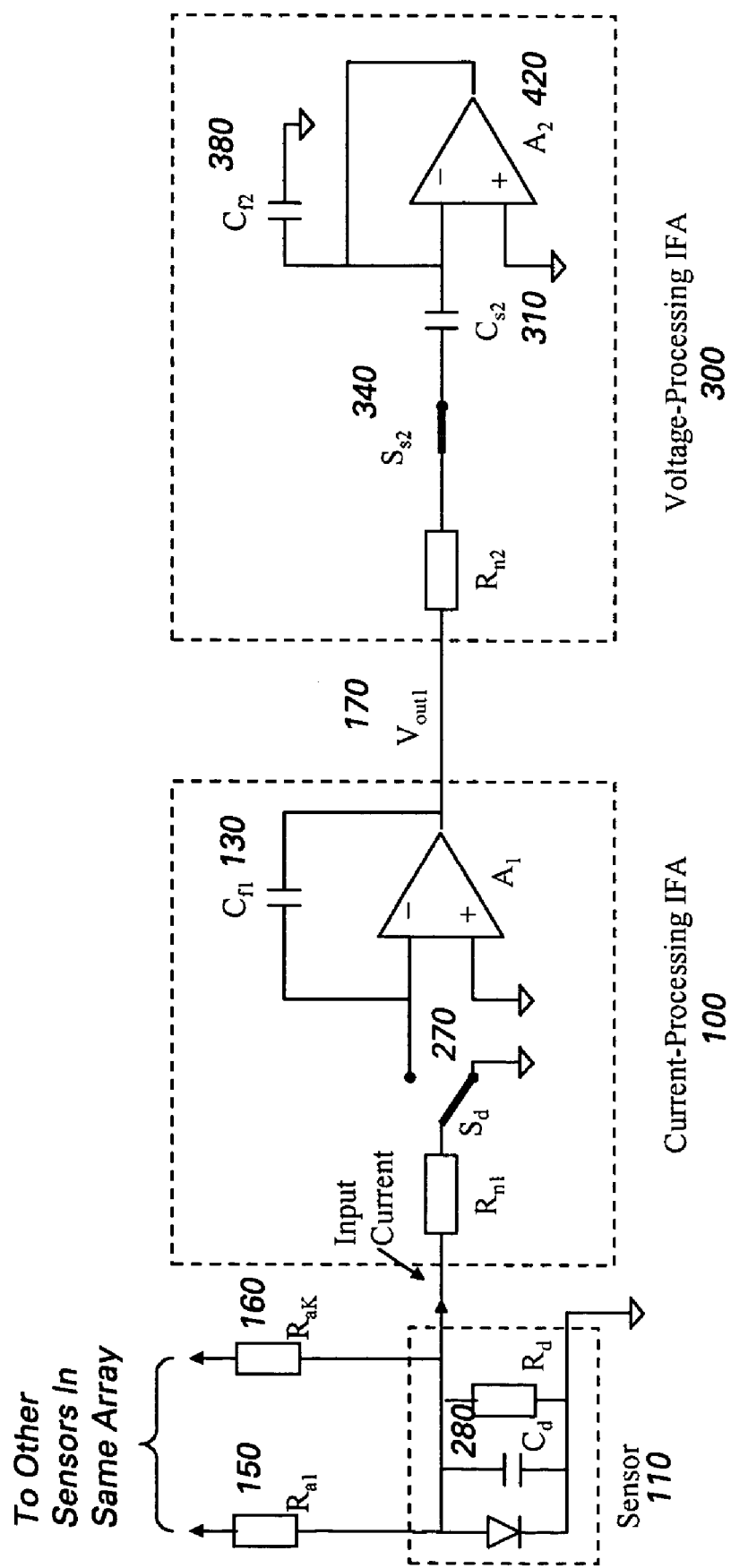
FIG. 5 is an embodiment of an interstage sampling circuit in accordance with embodiments of the present invention.

Referring to FIG. 5, in a second aspect of the present invention, an inter-stage sampling circuit for error reduction is provided as follows: disconnection of stage 1 input sensor (capacitance) during stage 1 output sampling to reduce stage 1–2 settling time; stage 2 pre-sampling to reduce stage 1–2 settling error; no stage-1 folding while stage 2 is sampling; time-average discharge-current limiter to insure that folding prevents integrator saturation/overflow; discharge-current-limiter bypass switch to insure all charge is counted by end of the view; no present stage folding during present-stage bypass; open present-stage bypass and discharge switches when sampling by next stage (speeds settling); and, no present-stage folding during next-stage sampling.

Figure 2:
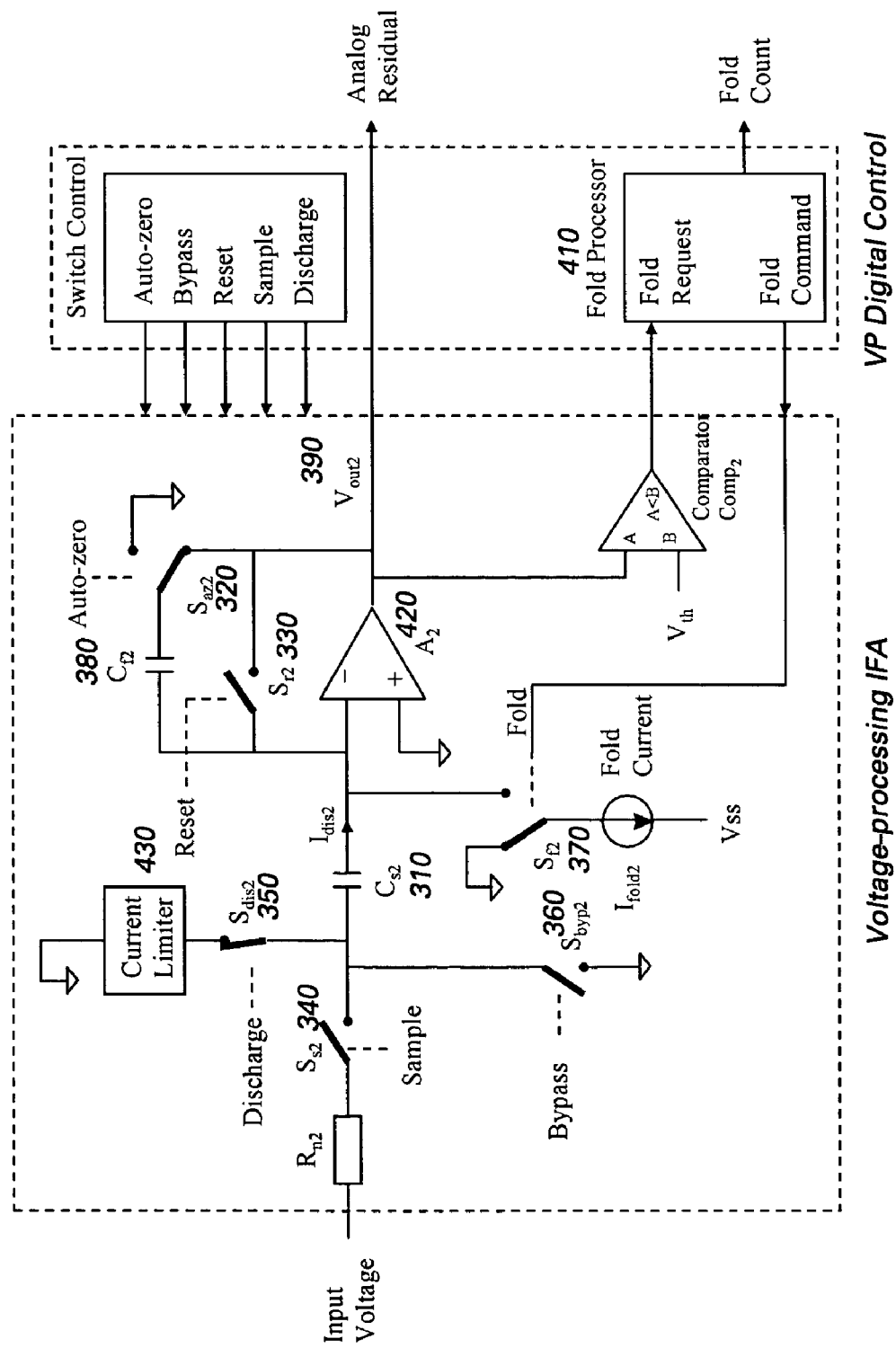
FIG. 2 is a systematic of a voltage processing integrate and fold amplifier stage (VPIFA) to which embodiments of the present invention are applicable.
Figure 3:
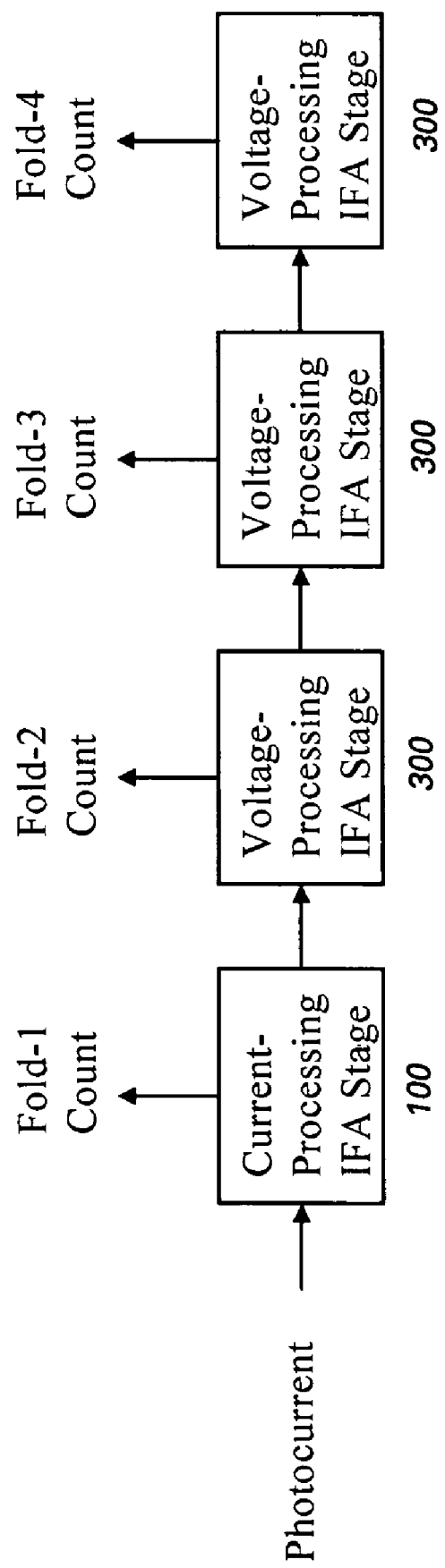
FIG. 3 is a schematic of a four stage pipelined charge to digital converter to which embodiments of the present invention are applicable.

While FIGS. 1 and 2 each show stages 1 and 2 (respectively) with their switches set for integration (charge measurement phase), FIG. 5 shows stages 1 and 2, $S_d$ and $S_{s2}$ with switches $S_d$ and $S_{s2}$ set for stage-2 sampling of the stage-1 residual output. For simplicity, some switches from FIGS. 1 and 2 are shown in FIG. 5 as a direct connection when closed or are not shown at all when open.

Pipeline operation of stage 2 consists of first sampling the residual output of stage 1, and then measuring the sampled value. During the sample process, $V_{out1}$ 170 from stage 1 is "copied" onto sample capacitor $C_{s2}$ 310 while $C_{f2}$ 380 is reset. Connecting $C_{s2}$ 310 to the negative input of VPIFA amplifier $A_2$ 420 (instead of being connected to ground) provides cancellation of the non-zero input-offset voltage of amplifier $A_2$ during the sampling process. Similarly, connecting $C_{f2}$ 380 to the negative input of amplifier $A_2$ 420 (when sampling) provides cancellation of the non-zero input-offset voltage during the subsequent charge-measurement phase.

For accurate stage-2 sampling (and high C/D linearity/accuracy), the voltages on $C_{s2}$ 310 and $C_{f2}$ 380 must sufficiently settle before sample switch $S_{s2}$ 340 is opened. Stage-1 sensor switch $S_d$ 120 is provided to disconnect the sensor 110 from the input of stage 1 during the stage-2 sampling process. This dramatically decreases the $C_{s2}$ 310 and $C_{f2}$ 380 voltage settling time because 1) Sensor capacitance $C_d$ 280 is removed from the input of $A_1$ 270 and
2) Amplifiers $A_1$ 270 and $A_2$ 420 each have non-zero output resistance and finite bandwidth.

The sensor is grounded when not connected to the stage-1 input in order to keep the sensor voltage small. This helps to reduce the settling time required for accurate subsequent resetting of stage 1.

It should be noted that disconnecting the sensor from stage 1 input will reduce stage-1 output sample settling time even when stage 1 is sampled by a conventional A/D converter (instead of a VPIFA).

Figure 6:
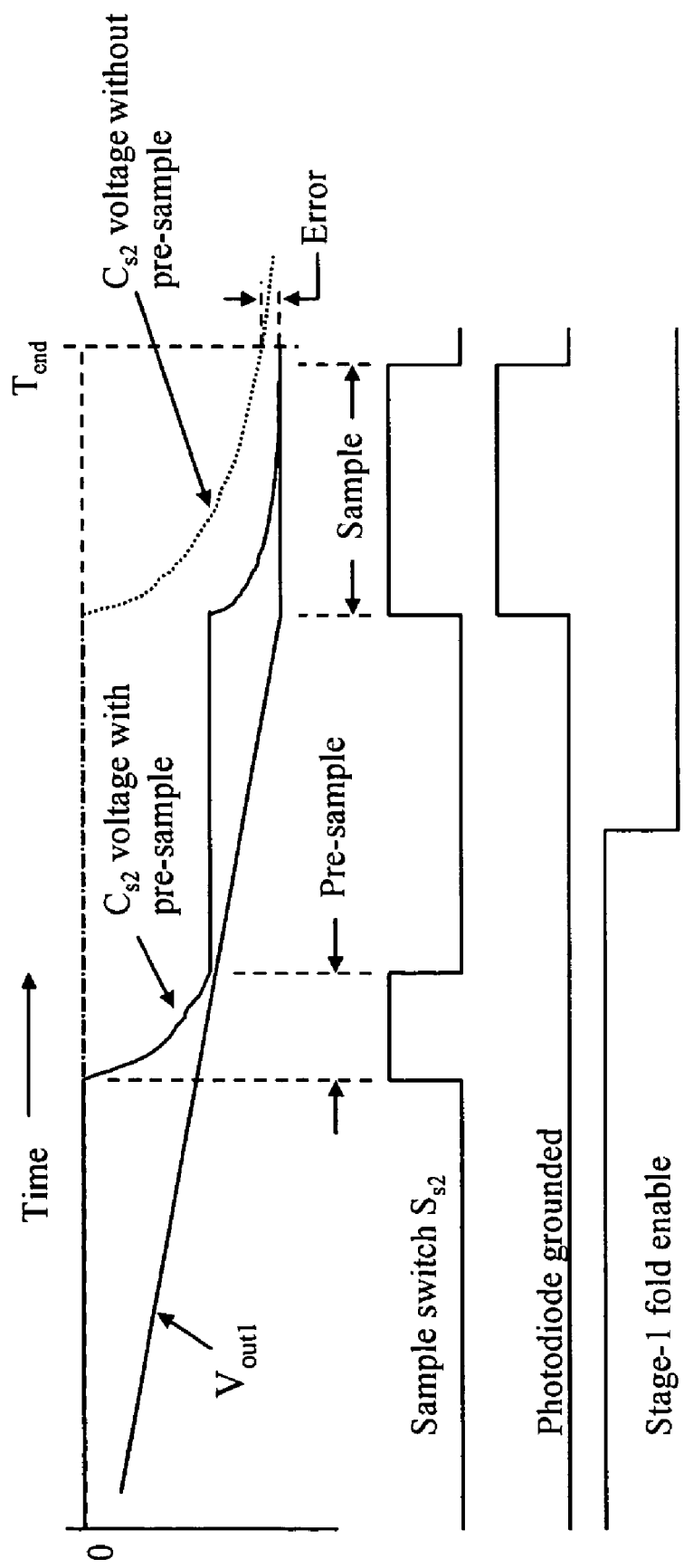
FIG. 6 is a graphical illustration of the interstage sampling time employing the interstage sampling circuit of FIG. 5.

FIG. 6 shows a stage-1 integration period and the associated stage-2 sampling and pre-sampling intervals for the case of a small current. Note output voltage $V_{out1}$ is a slowly changing ramp. The first closure of stage-2 sample switch $S_{s2}$ (340-FIG. 5) is the pre-sample, and it occurs without shunting the current to ground. The second closure of $S_{s2}$ 340 completes the sample process and is accompanied by disconnecting the sensor from the stage-1 input for more-rapid settling. See that pre-sampling shortens the time that current must be ignored by stage 1. In general, Pre-sample can be immediately adjacent to Sample and there need not be an intervening period where $S_{s2}$ 340 is open.

Folding in stage-1 causes large changes of $V_{out1}$ that must settle if the stage-2 sample is to be accurate. Extended sample-settling time requirements are avoided by disabling folding in stage 1 sufficiently before and during Sample.

It is to be appreciated that the embodiment described above with respect to a first and second stage can be extended to multiple adjacent stages, or alternatively to pipelined stages, and is not limited to a first and second stage.

Another source of error in a VPIFA is the incomplete discharging of sample capacitor 310 $C_{s2}$ by the end of the integration period, that is, not integrating all of the input charge that was sampled onto sample capacitor 310 (FIG. 2 or 5) $C_{s2}$. Referring again to FIG. 2, note there is a current limiter 430 in series with discharge switch $S_{dis2}$ 350. During integration, current limiter 430 insures that the time-averaged discharge current $I_{dis2}$ is kept small enough for the time-averaged fold current (pulses of $I_{fold2}$) to be effective in avoiding integrator saturation. Once the remaining charge in sample capacitor 310 $C_{s2}$ has become so small that integrator saturation is no-longer possible, the time for complete discharge can be shortened by removing the current limiter 430 (increasing the discharge rate). This can be accomplished by using a switch to bypass the current limiter 430, as shown in FIG. 2. Without bypass, the discharge current $I_{dis2}$ decays too slowly and leaves too much charge uncounted at the end of the integration period. With bypass, discharge current $I_{dis2}$ suddenly increases and also decays more quickly so that no charge is left uncounted. During the bypass process, folding can be disabled to insure that no extra settling time will be needed to recover from a fold-induced transient in the residual output voltage. Another reason for disabling folding when the bypass switch is closed is to keep all folds the same size (charge). Because the integrator time delay changes when the bypass switch is closed, folds that occur with the bypass switch closed will not remove the same charge as folds that occur when the bypass switch is open.

After waiting long enough to insure that bypasses discharge is sufficiently completed, the residual of the present VPIFA stage is ready for sampling by a following VPIFA in the pipeline. Sampling by the following stage causes a transient in the residual output voltage that must settle out for an accurate sample. The settling time is reduced by opening the bypass and discharge switches in the present stage. This removes the sample capacitor $C_{s2}$ 310 from the input of amplifier 420 $A_2$ and increases the present-stage bandwidth. This is similar to the effect of disconnecting the sensor when stage 2 (VPIFA) samples stage 1 (CPIFA).

To avoid next-stage sample corruption by a poorly timed final fold in the present stage, present-stage folding is also disabled just prior to and during the next-stage sample process.

Therefore, an exemplary embodiment of a very linear pipelined IFA-based C/D converter will include one or more of the following processes/steps: disconnecting stage-1 input from sensor during stage-2 sampling of stage-1 output (to reduce sample settling time); stage-2 pre-sampling of stage-1 output (to reduce stage 1–2 settling error); disabling of stage-1 folding while stage 2 is sampling (to avoid sample corruption); a discharge-current limiter (to insure folding prevents integrator saturation/overflow); timed bypassing of the discharge current limiter (to insure all sampled charge is counted by end of the integration period); disabling of stage folding when bypassing in that stage (to reduce subsequent sample settling and to avoid fold corruption); opening of present-stage bypass and/or discharge switches when sampling by next stage (to reduce sample settling time); and, disabling of present-stage folding prior to and during next-stage sampling (to improve sampling accuracy).

In a third aspect, VPIFA processing time is reduced by using a constant-current discharge limiter instead of a simple resistor. Once a VPIFA stage has sampled the output voltage of a prior stage, the sampled charge is ready to be discharged into the integrator and measured by folding. The time required to complete the discharge and measurement can be reduced by increasing the discharge rate. However, if the discharge rate is too high, folding will not keep the integrator from saturating. The shortest possible discharge time is achieved by using a constant discharge current that is nearly equal to the largest average folding current.

With both VPIFA and CPIFA stages, a fold is defined as a single fixed-duration pulse of pre-determined fold current. For a given consistent fold-pulse duration, and with only one fold-current source driving a stage, the shortest possible folding cycle can be no shorter than the fold duration itself, that is, constant folding. However, as was described in U.S. Pat. No. 6,366,231, the size of each fold is partially determined by its rise and fall times, and consistent fold sizes are most easily achieved by keeping folds distinct (each bounded by consistent rising and falling edges) and then using the same integer number of clock cycles to define each fold. Therefore, the shortest possible folding cycle is actually slightly greater than one fold per fold duration. If the input charge between folds (input current, averaged over the smallest fold period) is consistently larger than the fold charge, folding will not keep the integrator from saturating. Thus some method must be used to keep the average input current between folds significantly less than the fold current itself. This is the current-limit criteria. With the CPIFA (stage 1), the stage is desirably designed to handle the largest anticipated current. However, with the VPIFA (stages 2–4), the input current is $I_{dis}$ and it can be limited so that it satisfies the current-limit criteria.

Figure 7:
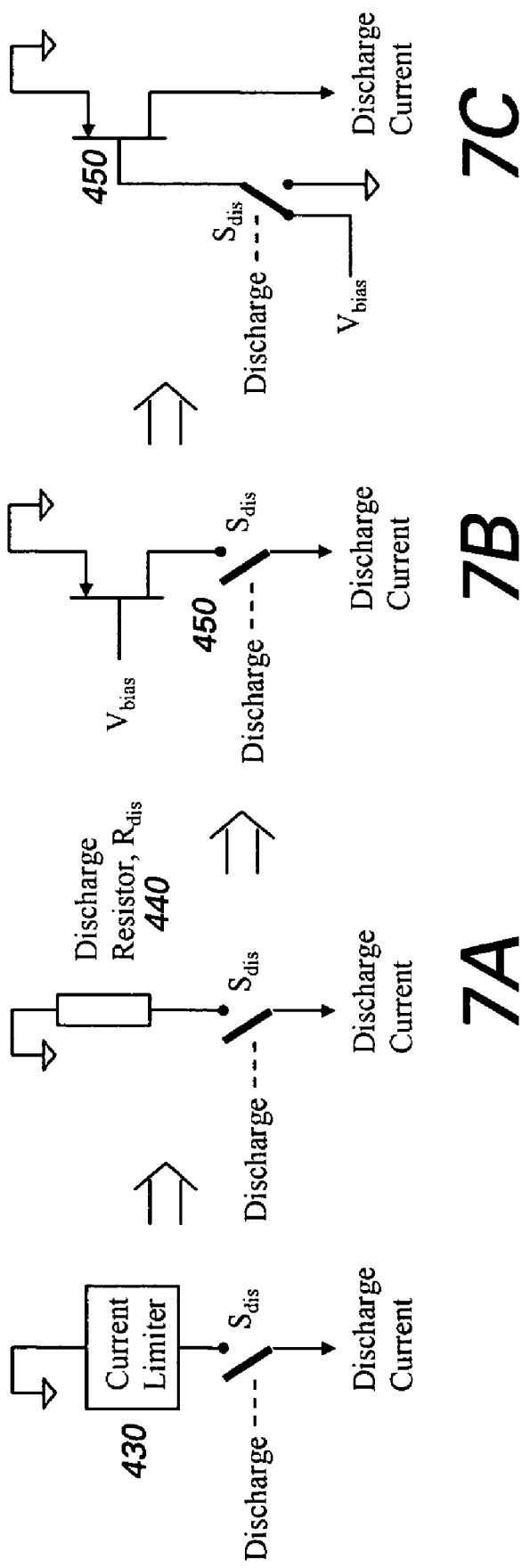
FIG. 7A–C illustrate embodiments of discharge-current limiters applicable to embodiments of the present invention.

Referring to FIG. 7, three discharge-current limit embodiments for current limiter 430 of FIG. 2 are provided. As illustrated in FIG. 7A, one embodiment to limit $I_{dis}$ is to use a fixed value resistor 440 with value chosen so that the largest sample voltage will not cause $I_{dis}$ to violate the current-limit criteria. This embodiment has the disadvantage that the sample charge, the folding rate, and $I_{dis}$ will all diminish exponentially as the sample is discharged into the integrator. Toward the end of the integration period, charge processing is taking much longer than necessary.

A second embodiment, as illustrated in FIG. 7B, to limit the input current uses a transistor 450 in place of the resistor of FIG. 7A. With a transistor, the discharge current remains nearly constant until the voltage on the sample capacitor drops below some low value. At that point, the transistor can no longer remain in saturation and it begins to act more like a constant resistance. The discharge current then decays exponentially, as was the case for resistor 440 of FIG. 7A. However, this embodiment has the advantage that much of the total sample charge is discharged at a consistently high rate. With this method, the stage processing time can be made much shorter than with resistor 440.

A third embodiment is similar to using transistor 450 of FIG. 7B, but puts the discharge switch on the gate of the constant-current transistor 450. This removes the discharge switch from the sensitive discharge-current line and helps make the circuit less sensitive to discharge-command feed-through (switch charge injection).

A preferred embodiment of a very linear pipelined IFA-based C/D converter will include constant-current limiting embodiments shown in FIG. 7B or 7C.

A further aspect of the invention is to keep fold sizes constant as follows: stage 2–4 discharge interruption to avoid fold-discharge interaction and associated fold-size corruption; constant-current discharge rate from each stage sample cap to reduce $V_{in}$ variation (due to incomplete settling when fold and discharge are non-overlapping) and to reduce the average stage-conversion time; reduce discharge-command charge injection by not turning discharge completely off; timeshare fold current for all stages in channel to reduce thermal/temporal drift of stage-relative fold-sizes; and, a folding grid with inter-fold settling time allows fold-current timesharing and simple flexible centralized multi-channel grid-signal generation.

It was previously mentioned that, during integration, the voltage at the inverting input of the CPIFA or VPIFA integrator is approximately proportional to the input current, with a small proportionality coefficient (e.g., 1 mV/uA). This small voltage can yield a voltage-dependent charge theft from a fold as described below. To keep all folds the same size, either the voltage must be held constant or made to be zero.

Figure 8:
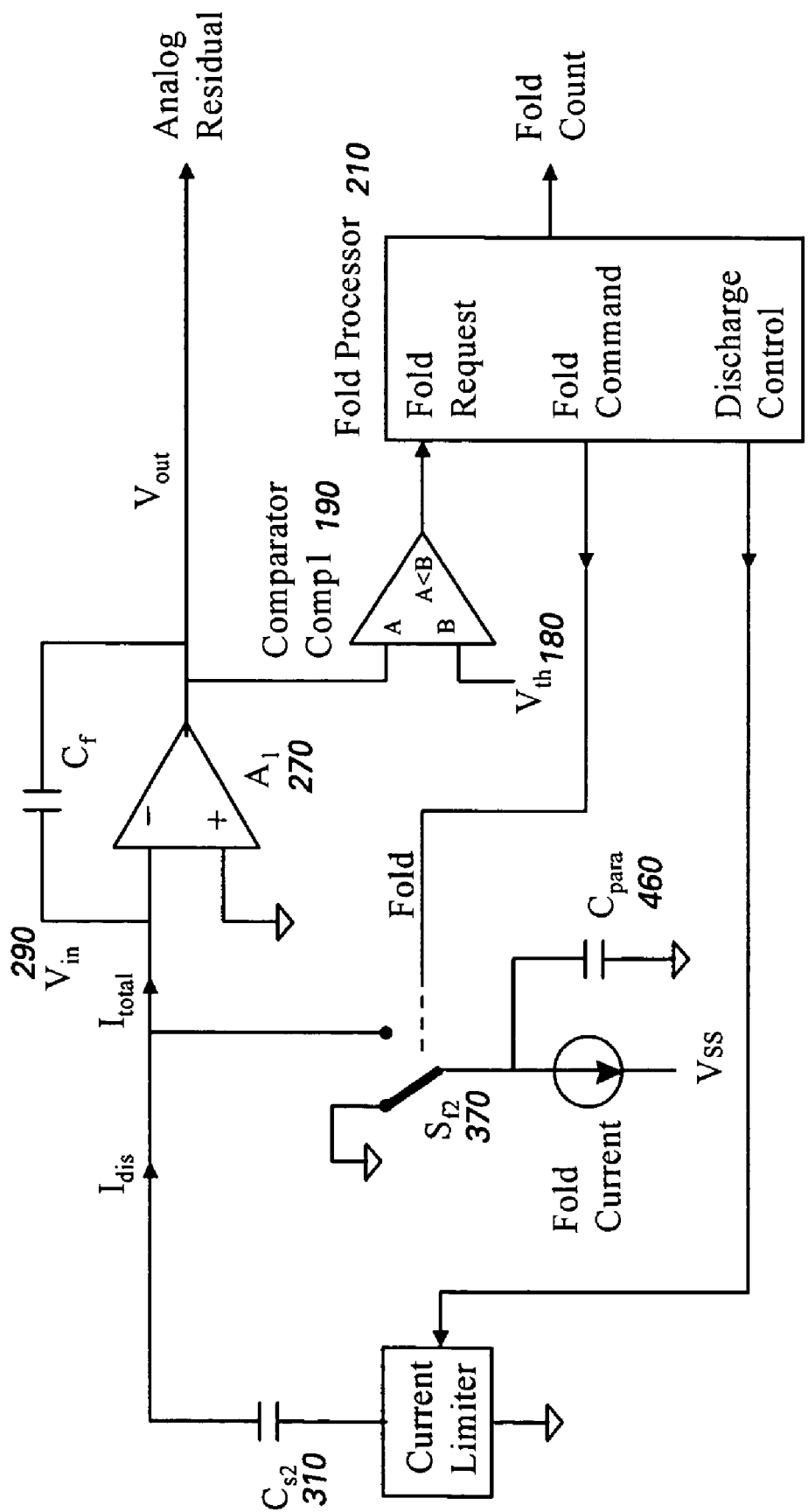
FIG. 8 illustrates an embodiment of a sample discharge gating circuit from FIG. 7C.

FIG. 8 shows the VPIFA of FIG. 2 with switches (not shown) set for discharging sample capacitor 310 $C_{s2}$ into the integrator. It also shows embodiments for discharge control as described below. The output voltage from the prior stage (not shown) has already been sampled onto sample capacitor 310 $C_{s2}$, and discharge current $I_{dis}$ is flowing into the integrating comparator 270 $A_1$ inverting input. As shown in FIG. 8, input voltage 290 $V_{in}$ is the integrator input voltage that is proportional to $I_{total}$. When a fold is not in progress, the fold current is shunted to ground via fold switch 370 $S_{f2}$ as shown in the figure. Furthermore, the fold-current source and the parasitic capacitance $C_{para}$ both see ground potential. Also, $I_{total}=I_{dis}$. When a fold occurs, the fold-current source and the parasitic capacitance are both connected to the integrator inverting input via $S_2$, and $I_{total}=I_{dis}-I_{fold}$. The parasitic capacitance sees its voltage change from zero to input voltage 290 $V_{in}$. The voltage change causes parasitic capacitor 460 $C_{para}$ to steal positive charge from the integrator input node when $V_{in}$ is positive. This charge theft is distinct from the normal fold charge, and effectively increases the size of the fold. This makes the fold size dependent on $V_{in}$ and therefore on $I_{dis}$.

If $I_{dis}$ could be made constant until all discharge current was integrated, then all folds during the discharge would have the same parasitic-capacitor charge-theft perturbation, and all folds would thus be the same size. The discharge current $I_{dis}$ is very difficult to hold constant as the remaining charge becomes small. A fold that occurs late in the discharge period, when $I_{dis}$ is reduced, will not be the same size as one that occurred earlier when $I_{dis}$ was larger.

Figure 9:
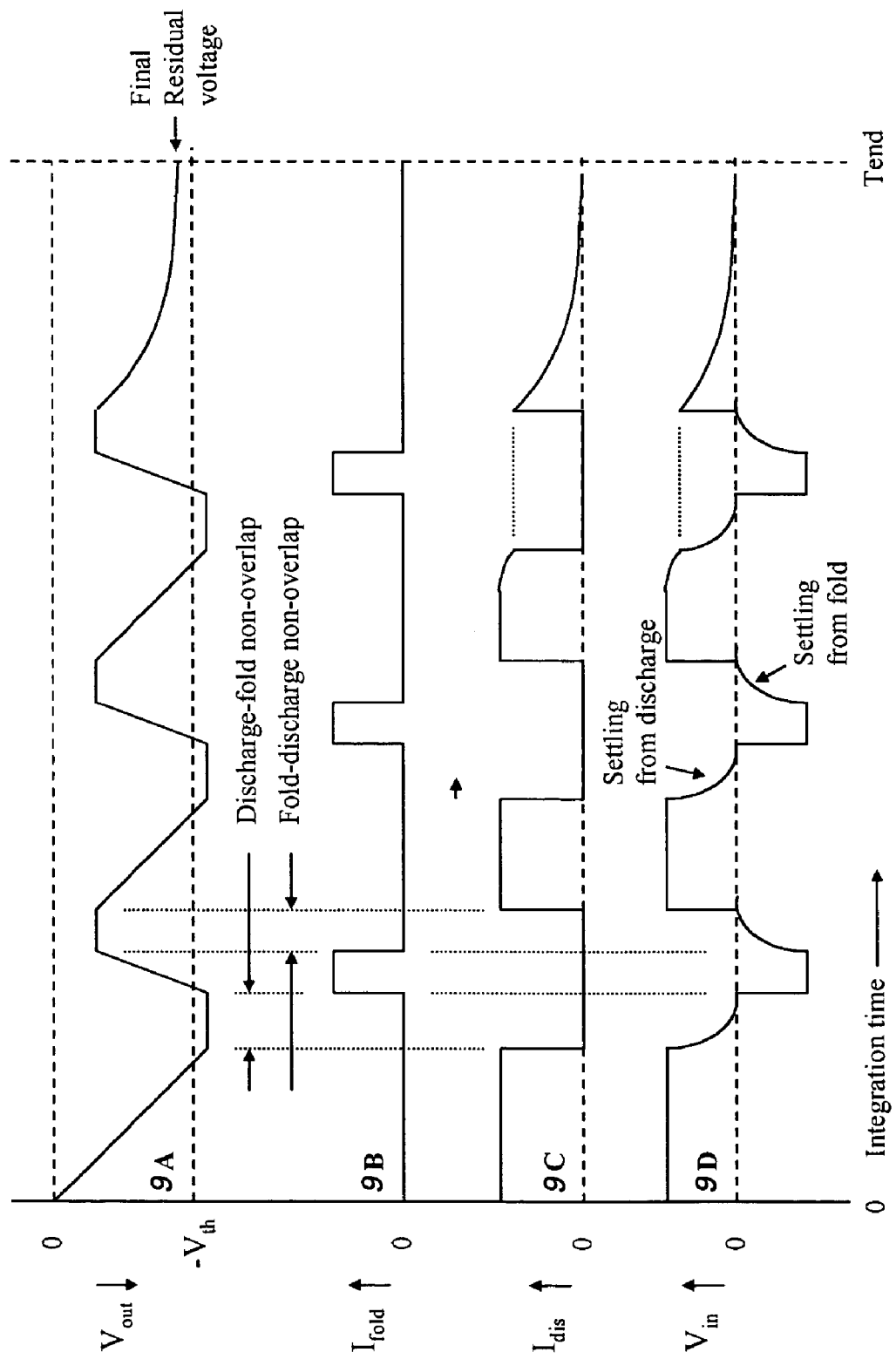
FIG. 9A-D illustrates an embodiment gated current discharging in accordance with the current limiter embodiment of FIG. 7C.

Referring to FIG. 8, a method to avoid the dependence of fold size on $I_{dis}$ is to stop the discharge ($I_{dis}=0$) before a fold occurs, then restart the discharge after the fold is completed. This is shown in the timing diagrams of FIG. 9. FIG. 9A shows how $V_{out}$ of FIG. 8 would vary over time as discharging and folding proceed. First, discharging is enabled and $V_{out}$ negatively increases until a fold is requested by Comparator 190. The fold Processor then stops discharge by controlling the discharge current limiter. This is seen in FIG. 9C where discharge current $I_{dis}$ is taken to zero, and in FIG. 9A where $V_{out}$ stops changing. As shown in FIG. 9D, some time is required for $V_{in}$ to settle from the change in $I_{dis}$. The fold processor waits for a discharge-fold "non-overlap" time for $V_{in}$ to settle, then issues the fold command, as shown in FIG. 9B. After the fold, discharge is re-started. A short fold-discharge non-overlap time is used to insure folding is finished before discharge is re-started.

It should be noted that avoiding fold-size corruption is also important in the CPIFA (stage 1). Interaction between current and fold current is similar in the CPIFA to the interaction between discharge current and fold current in the VPIFA. However, it is desirable to avoid disconnection of the sensor from the CPIFA input during integration because this would cause undesirable voltage perturbations (and an associated increase in average leakage current) on the sensor as charge accrues on the sensor and interconnection capacitance. Alternatively, if the sensor is grounded when disconnected, then repeated connection/disconnection would yield increased 1/f noise. With the CPIFA, changes in fold size due to current variations are reduced by designing the CPIFA amplifier to have a very small time delay. This reduces the proportionality constant between input current and input voltage to a very small value. This approach is avoided in the VPIFA because amplifiers with lower time delays are larger and use more bias current.

In a preferred embodiment, discharge control is used with a practical constant current source to reduce the time required for discharge, as was discussed earlier. Discharge control with a constant-current discharge has the added advantage that incomplete settling (at the end of the discharge-fold non-overlap period) will be more consistent than with non-constant-current discharging so that fold sizes will still be more consistent. Non-constant-current discharge can also be used (e.g., a simple resistor), but a longer settling time and longer total discharge time will be required.

Figure 10:
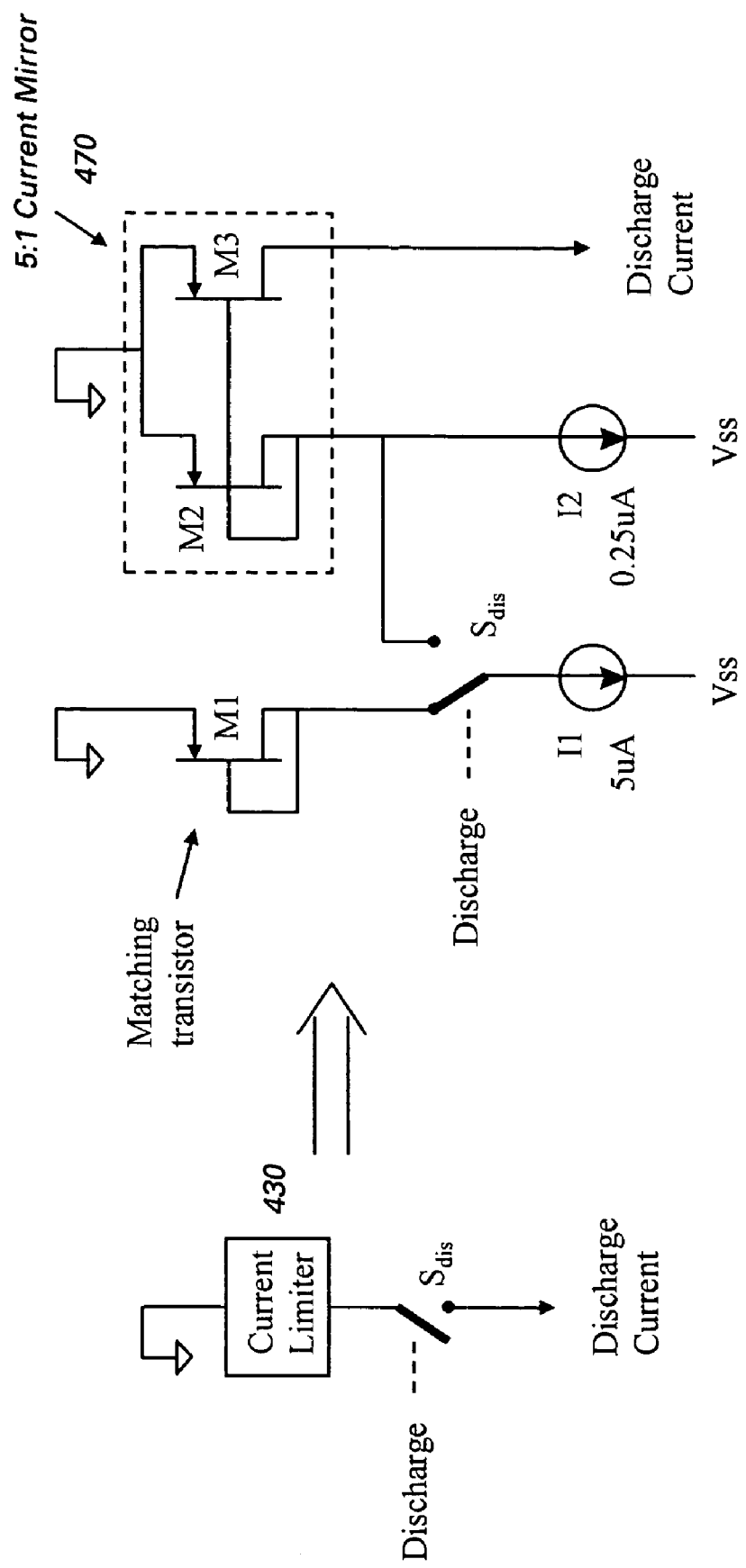
FIG. 10 illustrates another embodiment of a current discharge circuit useful for embodiments of the present invention.

A preferred method for constant-current discharge is shown in FIG. 10. It uses a modified form of constant-current embodiment of FIG. 7C. A transistor-mirror pair, M2 and M3, is used to generate the desired constant discharge current. Discharge control is isolated from the sensitive discharge current line to reduce control-signal charge injection. Charge injection can be further reduced by not completely turning off transistor M3 when discharge is to be stopped. Transistor M3 holds a channel charge when conducting current, and part of this channel charge adds to the discharge current when the transistor is turned off. Some of the M3 channel charge originates from the M3 gate voltage and is not part of the sampled charge from the prior stage. For minimal error, this charge should not be integrated. By not turning M3 completely off for each fold, most of the channel charge remains in the channel and is not repeatedly integrated. As is shown in FIG. 10, discharge current through transistor M3 is not turned off during a fold but is, instead, reduced by reducing the current to mirror transistor M2. The amount of reduction is set by the ratio of on and off bias currents, I1 and I2, respectively.

Because the ground node is often used as a reference, it is desired to keep its voltage at zero volts. By using dummy load transistor M1, with M1 matched to M2, the load on bias current source I1 will be nearly independent of the $S_{dis}$ switch position. This will make bias current I1 from any practical constant-current source also be the same for either position of $S_{dis}$. This means the bias current to ground will be independent of the position of $S_{dis}$, and this will keep any ground-resistance voltage drops constant.

With a multiple-stage IFA-based charge-to-digital converter, the relative fold sizes must be accurately known for all stages in order to combine the different stage counts to form an accurate digital charge value. If each stage uses a different fold-current source, the individual fold currents will change differently with temperature and the relative fold sizes will change. This relative fold-size drift can be avoided by timesharing a single fold-current source between all stages in a channel. Then, when the fold current slowly drifts with temperature or time, the relative fold sizes (ratio of sizes between stages) will remain constant and only the overall charge-to-digital conversion gain will change. Time-shared folding has another advantage: Folds from different stages are disjoint and so cannot directly overlap and crosstalk or interfere with each other. This relaxes some circuit layout constraints. Timesharing need not be applied to all stages in the channel. It can instead be applied only to the stages where the expected fold-current drift will cause significant digital output error (e.g., the early stages). Partial timesharing would allow shorter VPIFA integration times because there would be less waiting for fold availability.

Figure 11:
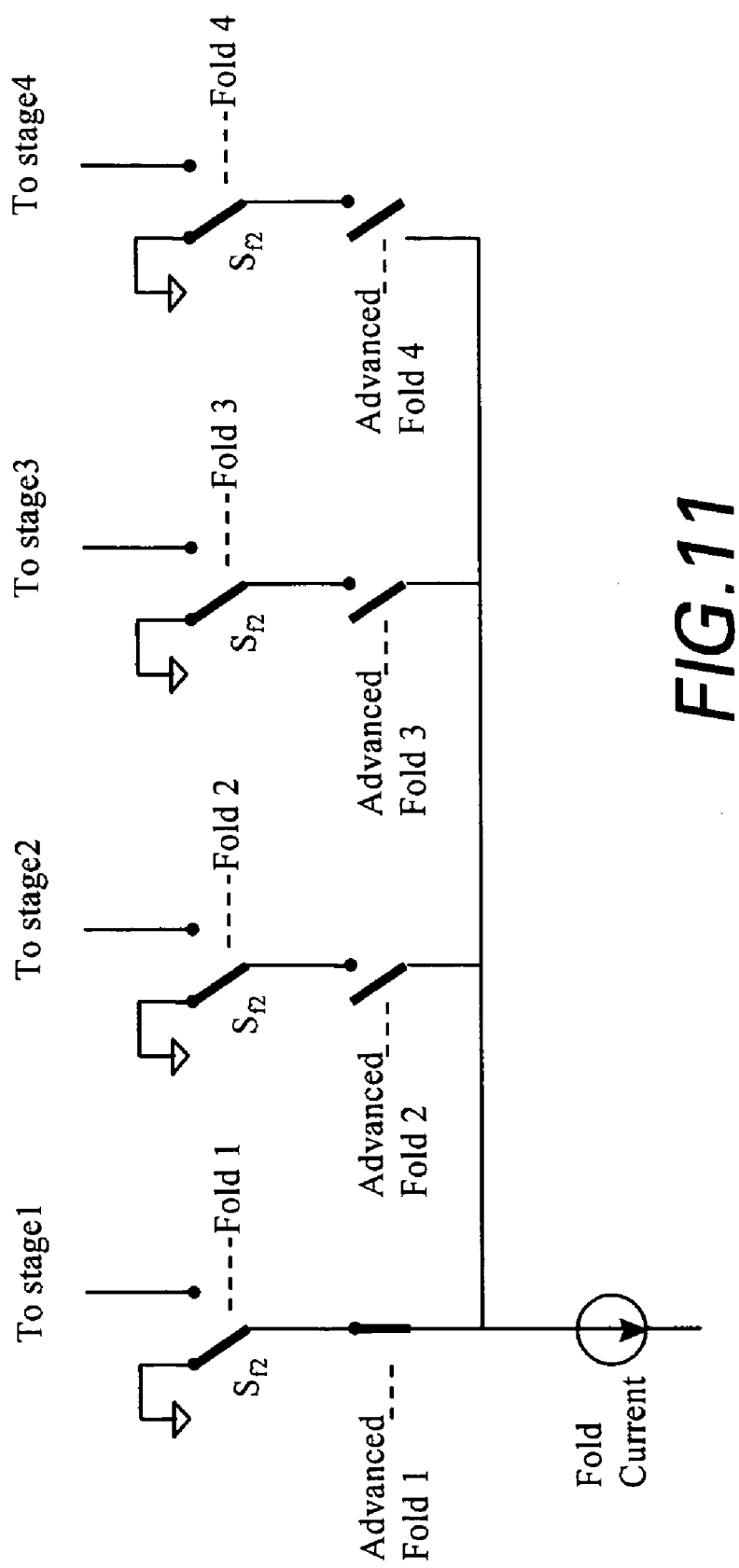
FIG. 11 illustrates a fold-current time-sharing method applicable to embodiments of the present invention.

FIG. 11 shows a method for fold-current timesharing. When a fold is to be performed in a stage, the fold current is first re-directed to a ground switch near the desired fold switch by activating the Advanced Fold for the desired stage. Next, the re-directed fold current is allowed to settle for a time from re-direction transients. Next, the fold is started by opening the ground switch and closing the Fold switch. This directs the fold current to the negative input of the stage integrating amplifier 270 as shown in FIG. 8, 2, or 1. Finally, the fold is ended by opening the Fold switch and closing the ground switch. The above steps are repeated for each stage fold. The use of "Advanced Fold" current redirection and local ground switches reduces layout-dependent and temperature-dependent fold-current switching transients at the onset of fold. This makes the fold size more predictable and consistent. Extra fold-current settling time is avoided by connecting the fold current to a ground switch even when no fold has been requested by any stage.

Fold-current timesharing can be done either "on demand", or on a pre-arranged schedule or "grid". With folding on demand, fold requests are prioritized, queued, and acted upon as quickly as the system clocking will allow. Prioritization might, for example, have stage 1 (CPIFA) jump to the head of the queue whenever a stage-1 fold is needed because it cannot stop the input current while waiting for a fold. On the other hand, stages 2–4 (VPIFA) can avoid overflow by stopping the discharge current. With on-demand timesharing, each channel in a multiple-channel design will need its own queue-management logic.

Referring further to FIG. 11, with a pre-arranged time-sharing grid, each stage gets the opportunity to use the fold current on a pre-arranged schedule, whether or not a fold is actually performed. With this approach, no folding queue is needed and only one grid-signal generator is needed for all channels on an integrated circuit. A stages folding priority is determined by the relative frequency of its folding opportunities. In one scheduled timesharing method, the following periodic stage-folding grid is used: (1, 2, 1, 3, 1, 4), (1, 2, 1, 3, 1, 4), . . . . Each folding-grid cycle provides three folding opportunities to stage 1 and one opportunity to each of stages 2–4. With the pre-arranged folding grid, the fold-current re-direction (Advanced Fold) can be either data dependent or data independent. Data-independent re-direction always moves the fold current to a stages local ground switch during the "advanced fold" grid time for that stage. Data-dependent re-direction always leaves the fold current directed to a default stage ground switch unless another stage requests a fold. Advance Fold current re-direction occurs for a stage only if the fold request was active at the onset of the Advance re-direction grid for that stage. The fold is performed, and the fold request is reset, only after the fold current has been re-directed. The Adv Grid and Fold Grid signals define the periodic grids for re-direction opportunities and folding opportunities, respectively. The Adv Fold and Fold signals are the actual commands to the Adv Fold and Fold switches for the associated stages, as shown in FIG. 11.

Figure 12:
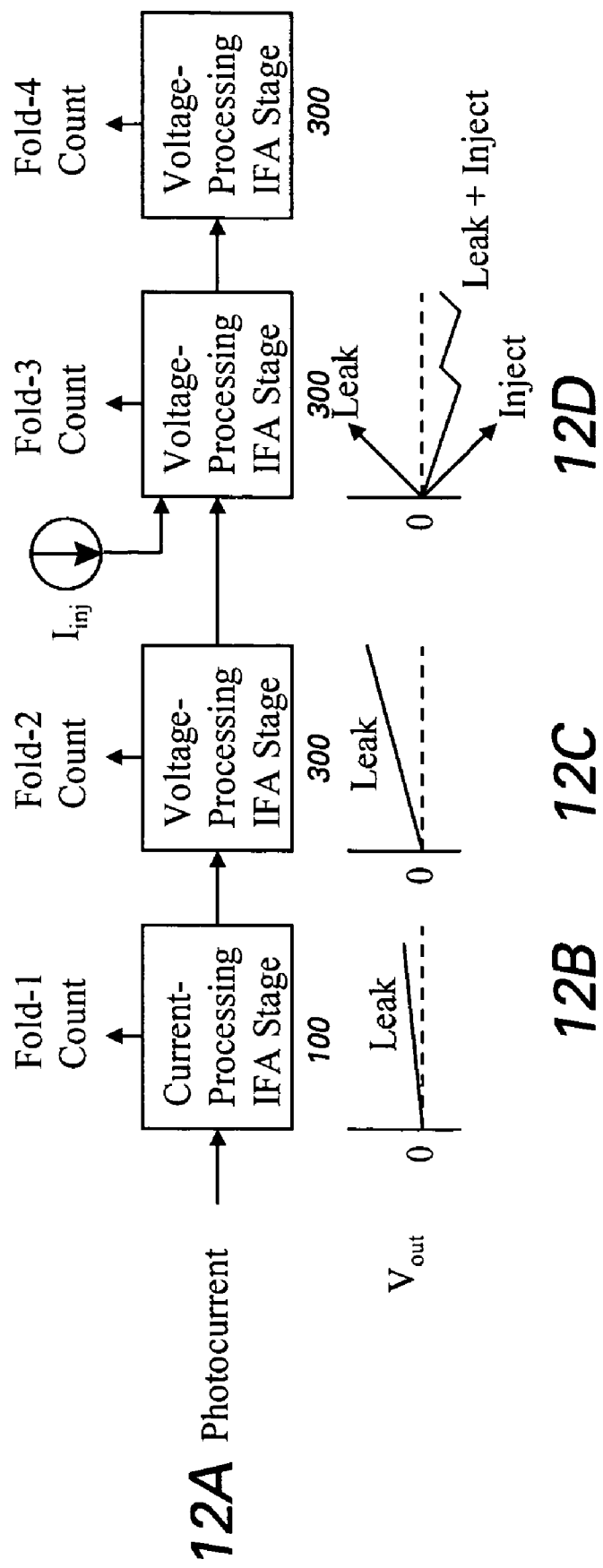
FIGS. 12A–C are schematic illustrations of embodiments for leakage-offset injections.

Therefore, a preferred embodiment of a very linear pipelined IFA-based C/D converter will include one or more of the following processes/steps: discharge interruption when folding in the VPIFA (to avoid fold-discharge interaction and associated fold-size corruption); constant-current discharge in the VPIFA (to reduce the average stage-conversion time and to reduce $V_{in}$ variation during discharge); gated discharge method of FIG. 12 (to reduce discharge-command charge injection by not turning discharge completely off); timeshare a single fold current between some or all stages in channel (to reduce thermal/temporal drift of stage-relative fold-sizes); use of a folding grid (for simple flexible centralized multi-channel grid-signal generation); and, use of Advanced Fold switching and inter-fold settling time (for accurate fold-current timesharing).

In a further aspect, single-direction folding is provided as follows: stage 3 injection to avoid negative folding requirement while allowing some negative sensor leakage-current dynamic range. The CPIFA and VPIFA shown in FIGS. 1 and 2 use only positively directed folding. Bi-directional folding capability could be achieved in each stage type by adding another comparator, fold switch, and an oppositely directed fold current source. It is desirable to avoid bi-directional folding because it raises the circuit complexity and increases the amount of fold-size calibration required. In this embpodiment, stage 1 (CPIFA) of the pipelined IFA channel receives input from a sensor. As connected in FIG. 1, actual (light-induced) current is always positive and directed into the channel input. However, sensors also have leakage current, as was discussed earlier with respect to the interconnected sensor array shown in FIGS. 1 and 5. The leakage current to the stage-1 input may be negative or positive, but it is small. Negative leakage, by itself, will cause a positive stage-1 residual charge that grows with each successive stage and cannot be "measured" with positive folds. If the actual current (not leakage) has smaller magnitude than the leakage current, there will be no folding in any stage of the pipeline. This means that below an input-charge threshold, all input-charge values will be incorrectly mapped to a digital zero output. All contrast-resolution will be lost for input charges below the zeroing threshold. It is desirable to avoid this small-signal error.

Small-signal zeroing (and the associated loss of small-signal contrast resolution) can be avoided by adding a sufficiently large constant positive offset charge to the input of a selected pipeline stage during every integration period (view). For example, zero can be prevented by injecting a positive offset charge to stage 1 that is larger than the most negative possible leakage charge. However, practical constant-charge or current sources are noisy, and injection of noisy currents in early stages (e.g., 1 or 2) can yield increased channel noise. By injecting a positive offset charge at the input of stage 3, small-signal zeroing can be avoided while keeping the channel noise small. FIG. 12 shows a 4-stage pipeline with a stage-3 injection current source and the resulting graphs of stage 1, 2, and 3 output voltage over an integration period. In series with the injection current source is an injection-control switch (not shown) that is similar to the fold switch shown in FIG. 11. A consistent charge is injected in a manner similar to folding . . . by disconnecting the current source from ground and connecting it to the stage integrator negative input for a specified length of time. In the graphs of FIG. 12, see that stages 1 and 2 both have positive residual voltages, but that stage 3 does fold and has a normal negative-residual output voltage. With sufficient constant injected charge, every view will have some stage-3 or 4 folding, even when the actual stage-1 input charge is zero or less. The channel output digital value will be non-zero with zero stage-1 input charge, and this digital offset value can be calibrated and subtracted from all digital output values.

Further, fold and injection-corruption reduction is provided as follows: make injection current disjoint from fold-current; make injection current disjoint from discharge current; single injection timing controller for all channels on the IC; stop folds and/or injections during predictable interfering-event times. Use programmable event times and fold/injection control to reduce design-validation simulations; and, organize fold signals and fold switches to avoid fold rise and fall-time modulation within the digital/analog buffers.

Figure 13:
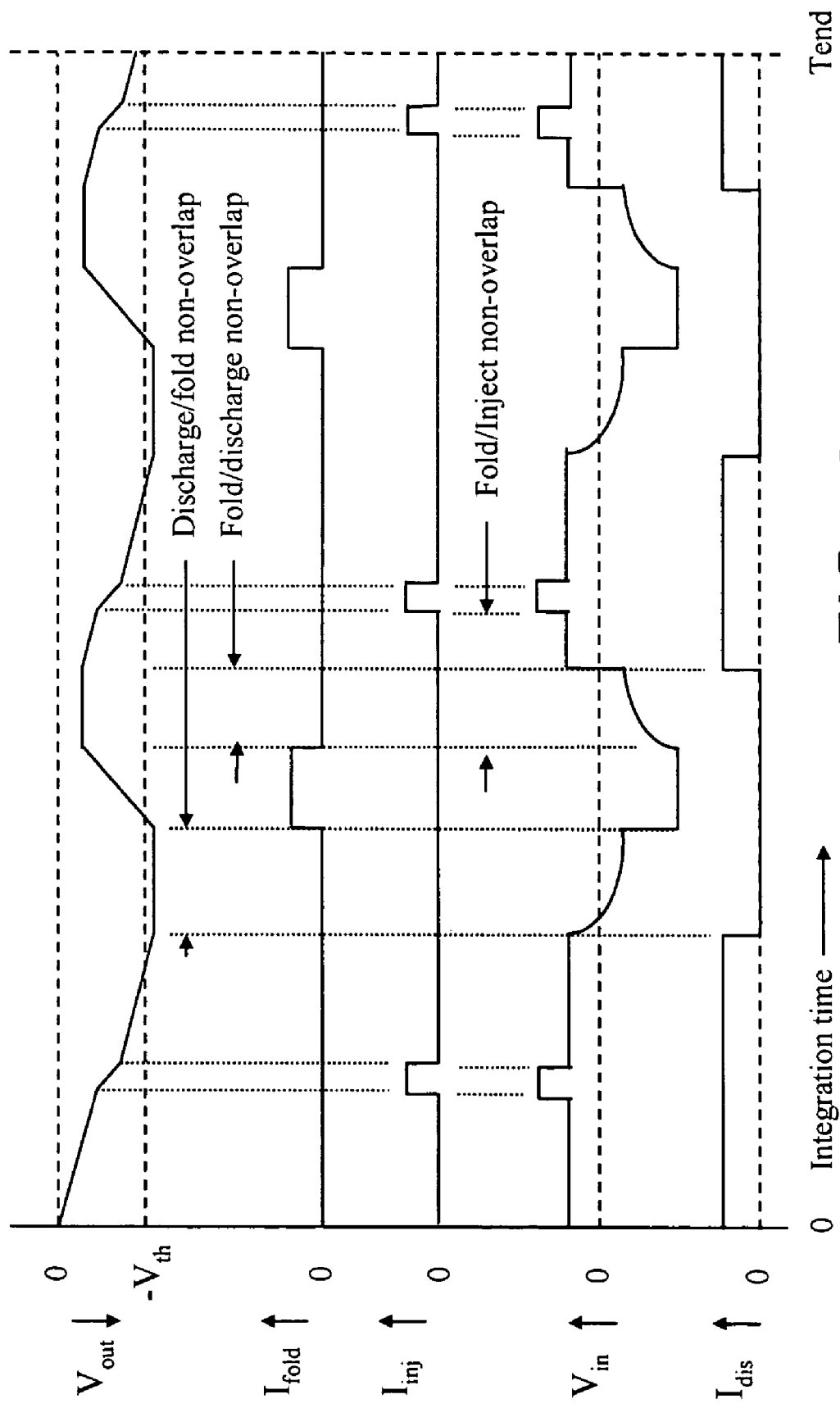
FIG. 13 is a graphical illustration in accordance with embodiments of FIG. 12.
Figure 14:
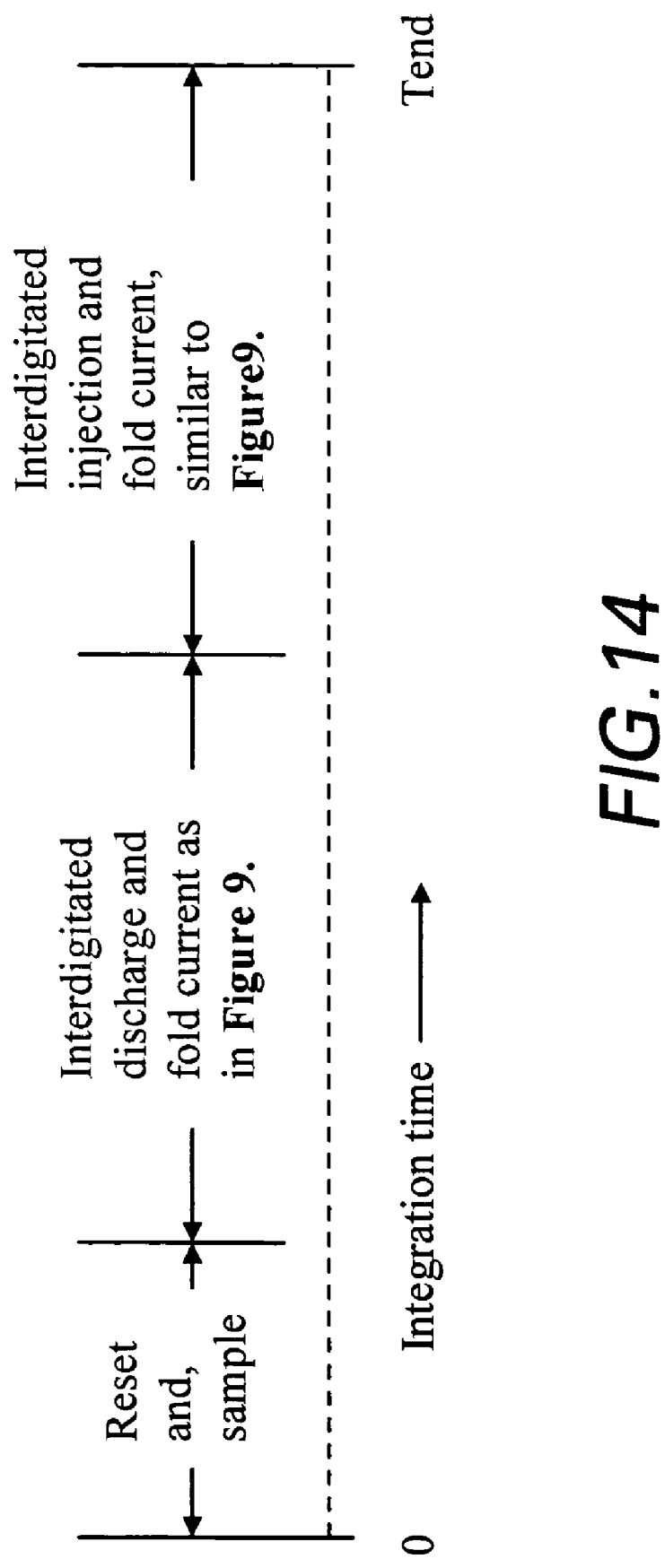
FIG. 14 is an illustration of a VPIFA integration cycle using injection current embodiments described with reference to FIGS. 12 and 13.

Fold and injection currents each change the integrator input voltage $V_{in}$, as was discussed above, and changes in $V_{in}$ alter fold and injection charge values. Interaction between folds and injections can be avoided by making folds and injections disjoint. An example of this is shown in FIG. 13 for the CPIFA (e.g., stage-3). The stage input current consists of $I_{dis}$ from the sample capacitor, $I_{fold}$ from the fold source, and $I_{inj}$ from the injection source. Discharge current $I_{dis}$ is stopped during a fold, as was described earlier (FIG. 9). Injection current is constrained to a pulse or pulses that occur only when not folding. In a similar manner, corruption of the injected charge by sample discharge current can be avoided by injecting only when discharge is also stopped (not shown). Non-overlap of all three currents is accomplished by commutating between separate fold, discharge, and injection periods. The total discharge and injection times can each be segmented into just one, or many commutation cycles. For example, all injections could be delayed until after the sample charge has been discharged. This is shown in FIG. 14. Another alternative is to delay or interrupt discharging until all injections have been performed. Yet another alternative is to add a separate injection period to the folding-grid cycle that was shown in FIG. 9. When a folding grid is used, injections for any stage can be constrained to specific times in the grid cycle and/or to specific grid cycles in an integration period. Furthermore, a single injection-control timing block can be used for all channels on an IC.

Figure 15:
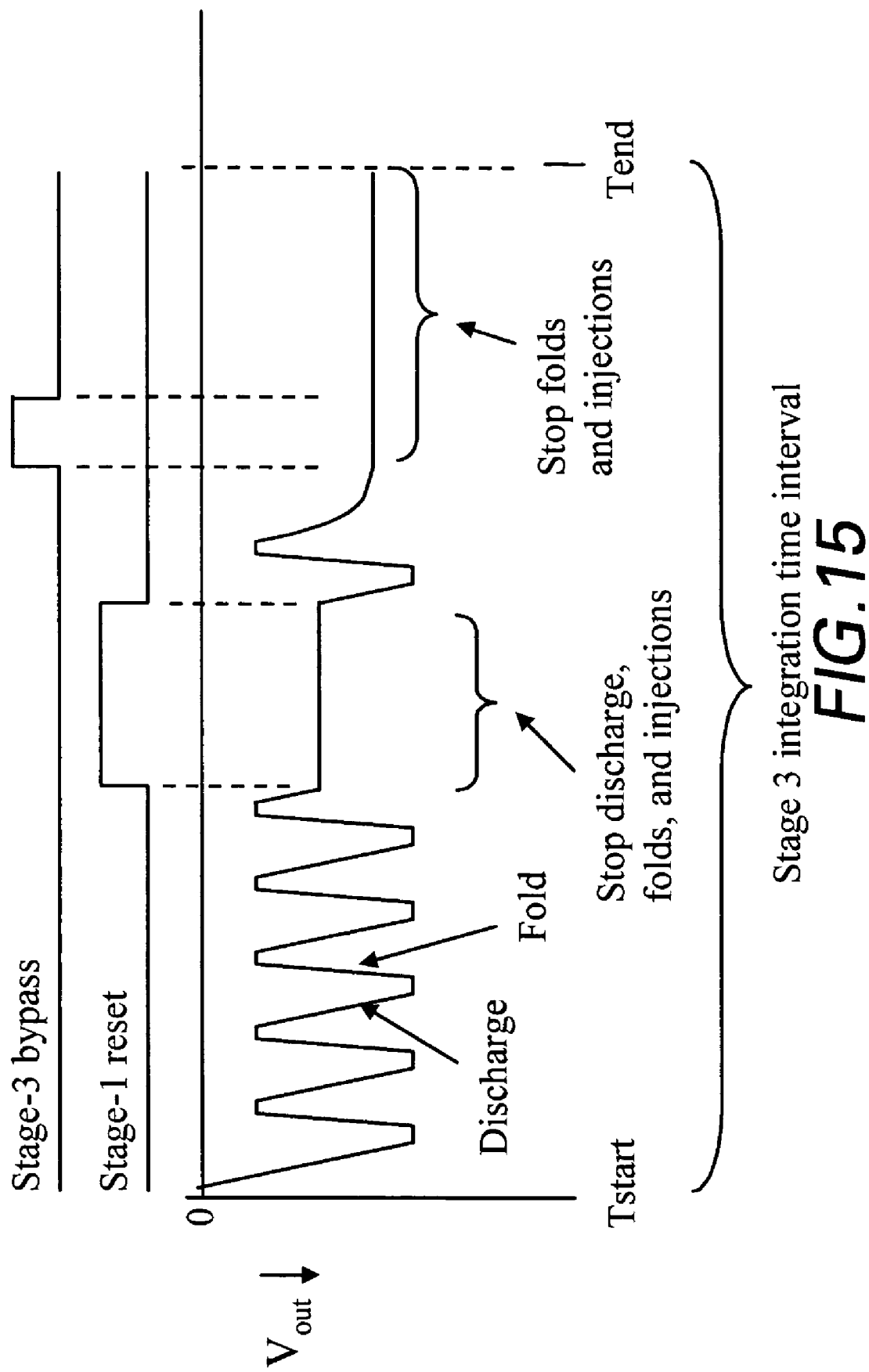
FIG. 15 is a graphical illustration when folds or injection currents are disallowed during a perturbing event.

With the multiple-stage pipeline, stages are reset, bypassed, sampled, and so forth, on a predictable (e.g., periodic) schedule. These stage operations cause analog switches to change state and transient capacitor currents to flow into local ground or power supplies. The transient currents perturb local ground and supply voltages, and the analog-switch control signals crosstalk to nearby sensitive signal lines. These unwanted perturbations can subtly change the size of a fold or injection that is underway during the transient. Ground-voltage perturbations and proximity crosstalk are difficult to completely eliminate because all interconnects have non-zero resistance and they have non-zero parasitic capacitance to nearby structures on the IC. However, fold or injection corruption can be avoided by disallowing any folds or injections during a perturbing event. An example of this is shown in FIG. 15. By making the timing of stage operations programmable, and/or making timing of the fold and injection suspension programmable, fold and injection corruption can be eliminated by adjusting the timing after the IC has been manufactured. This reduced the need for time-consuming layout-dependent crosstalk and corruption simulations during the design phase.

A successful layout of a multiple-channel IFA-based C-to-D converter in a standard CMOS mixed-signal process should have the digital and analog sections of the IC separated to minimize digital-switching noise in the analog section. Control signals that cross the digital-analog boundary should be buffered at the boundary to remove digital noise from the signals before entering the analog section and to afford driving potentially long routing lines in the analog section. One sensible layout has the buffer power supply lines routed along the digital-analog boundary with connections to off-chip power supplies made at the ends of the boundary. When a buffer changes state, the buffer power-supply routing resistance and inductance cause a local supply-voltage transient. The transient is small if only one buffer changes, but is larger if many buffers change at the same time. Supply transients that occur during the rise or fall of a buffered signal will alter the rise or fall time. Fold signals are particularly sensitive to rise or fall-time modulation because it changes the effective fold-pulse duration and therefore the fold size. If each channel has its own set of stage-fold buffers, and a pre-arranged folding grid and timing is used, then the size of any one fold will depend on the number of channels simultaneously folding. This is a form of non-linear channel-to-channel crosstalk because a change in fold size causes a change in the output digital value even though the channel-input charge was unchanged. Fold-size crosstalk must be kept very small for high-accuracy C-to-D conversion.

Figure 16:
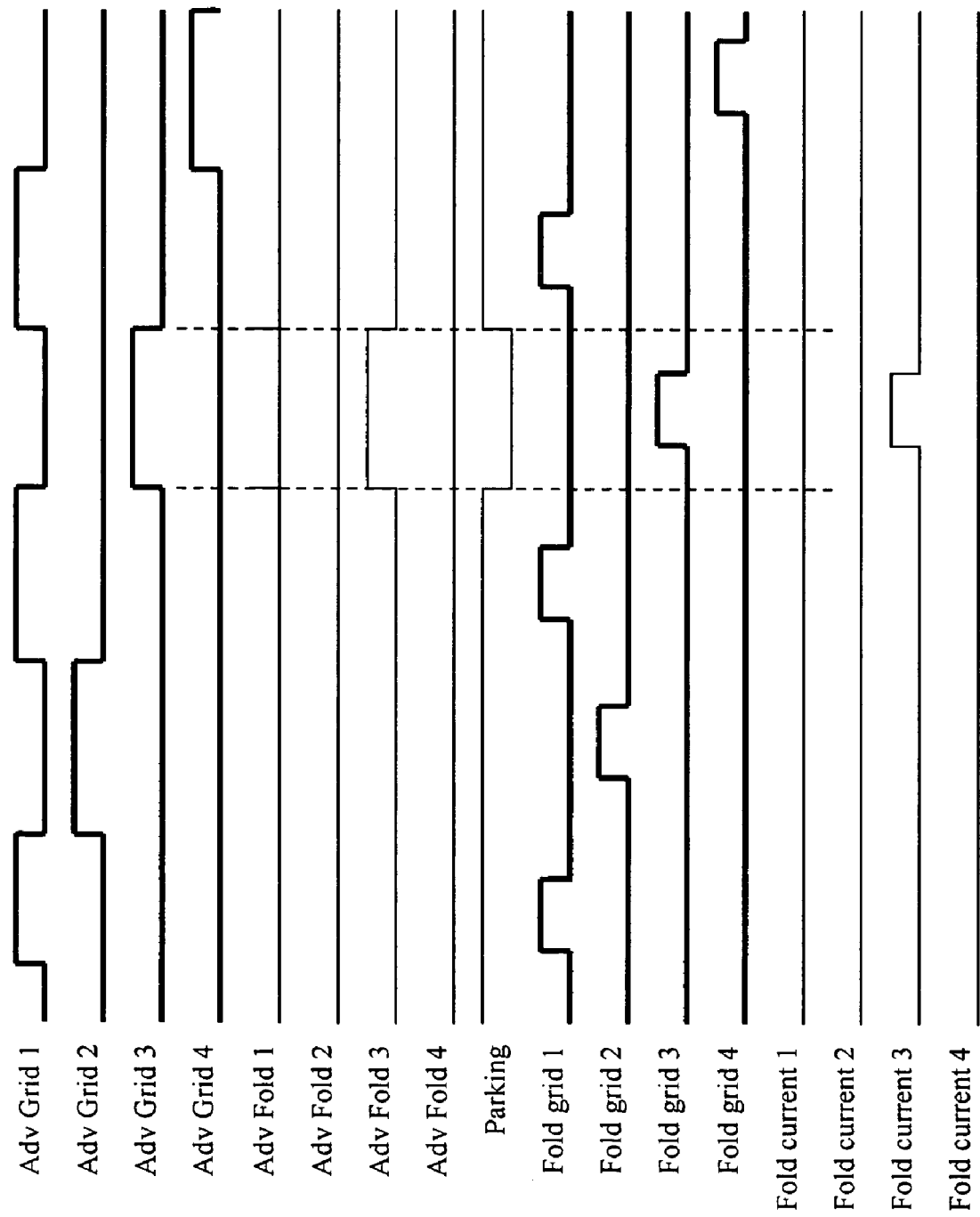
FIG. 16 is an embodiment of a timeshare folding grid for interchannel fold-crosstalk reduction.
Figure 17:
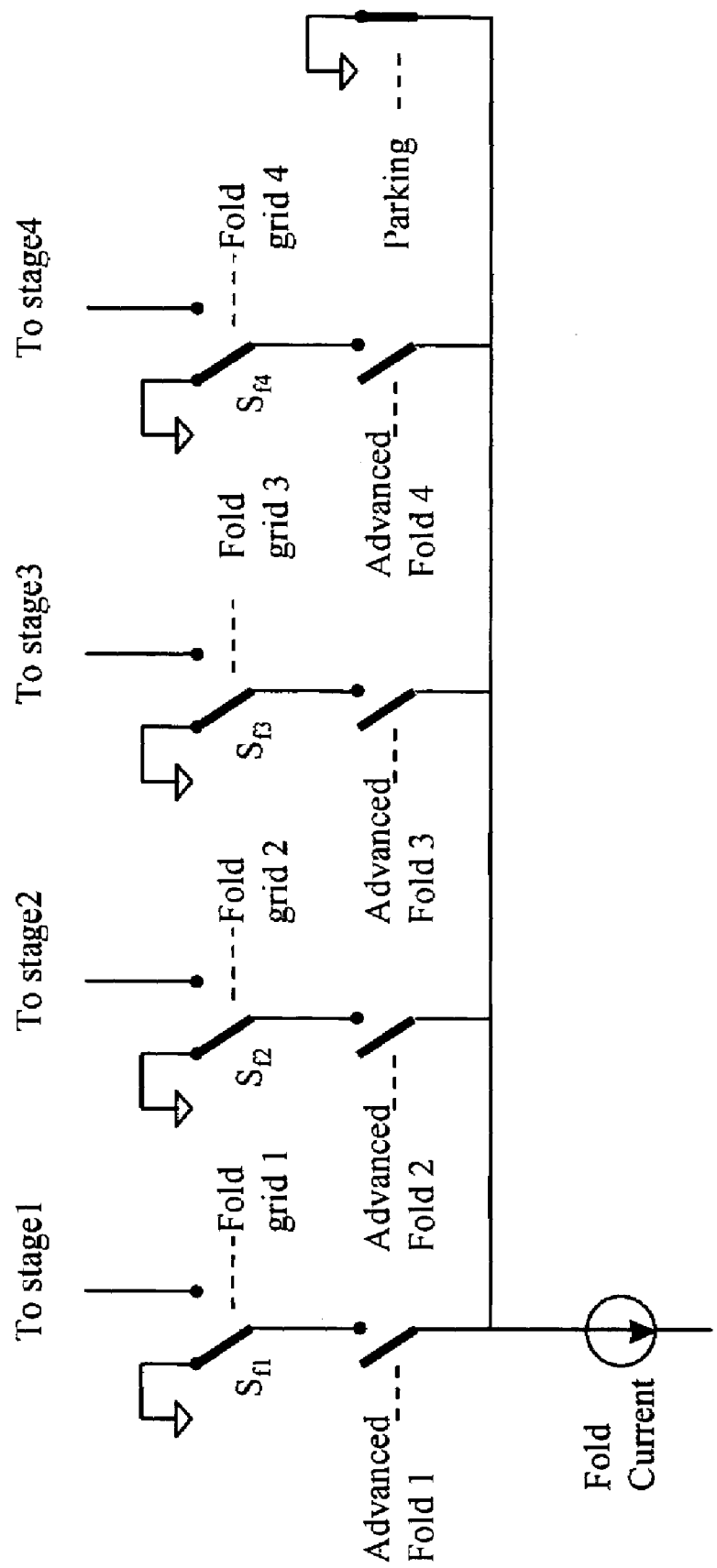
FIG. 17 is a schematic illustration of an embodiment for reducing fold cross-talk.

The buffer-induced fold-size modulation described above can be avoided by passing the data-independent fold-grid signals through the buffers instead of the data-dependent fold signals. The required data-dependent fold signals can be created in the analog section of each channel by forming the logical AND of the fold-grid signal with a data-dependent fold-selecting signal that turns on before and turns off after the selected fold grid. Data-dependent buffer power-supply transients will then occur at the rise and fall of the fold-selecting signal instead of at the rise and fall of the fold. Transients at the rise and fall of each fold-grid pulse will be consistent and data-independent. The fold-selecting signals can be similar to the Advanced Fold signals described in FIG. 11, but modified as shown in FIG. 16. Each Advanced Fold signal is active only when the associated stage is to fold. A "Parking" signal is added to each channel, and it is active when no stage is to fold. An active Parking signal diverts the fold current to ground. This is shown in FIG. 17.

Figure 18:
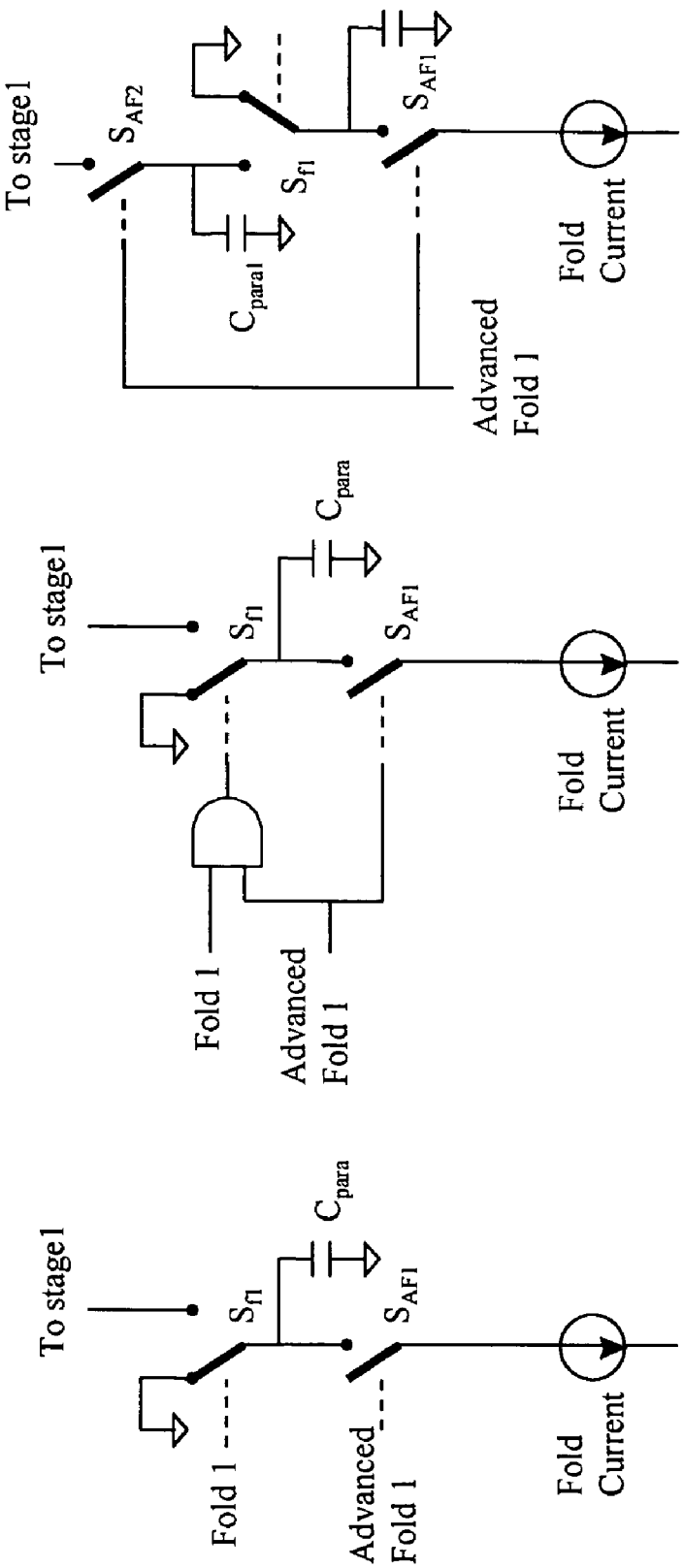
FIG. 18A-C are schematic illustrations of embodiments for fold-fold cross-talk reduction circuits.

FIG. 18 shows three different embodiments for combining the Fold-grid signal and associated Advanced Fold signal to control the folding current flow into a stage. In the embodiment shown n FIG. 18A, every stage-1 Fold-grid pulse will flip the Fold switch. However, fold current will flow only when both the Fold switch and the Advanced Fold switch are flipped. In the embodiment shown in FIG. 18B, an AND gate is used in the analog section to combine the Fold-grid and Advanced Fold signals so that the Fold switch is flipped only when fold current is actually desired. This has the advantage that the sensitive stage-input node is not loaded by $C_{para}$ until fold current actually flows. In the embodiment shown in FIG. 18C, a second Advanced Fold switch, $S_{AF2}$, is added. Here, the logical AND of FIG. 18B is effectively performed by the series connection of $S_{f1}$ and $S_{AF2}$. This has the advantage that no digital-gate supply currents are needed in the analog section.

An alternative to the fold-sharing method of FIG. 16 comprises multiplexing the four Fold-grid signals onto a single "Fold-grid" signal by forming the logical AND of the four Fold-grid signals. The new Fold-grid signal is connected to all stage fold switches. It can be common to all channels, but separately buffered for each channel if desired. Only the Advanced Fold signals are channel dependent and data dependent. The Advanced Fold signals act to enable folding current only in the proper stage and with the proper pulse from the Fold-grid signal. Alternatively, the embodiment shown in FIG. 18C can be used. This alternative fold-sharing method has the advantage of using fewer Fold-grid signals and associated routing lines.

In systems in which a brief change in the sensor voltage can be tolerated (this is dependant on the system requirements due to the type of sensor used), it is possible to operate this invention in a mode such that the sensor can be briefly and repeatably used as a charge storage device. This further embodiment and method will be referred to as Fold Dependant Charge Storage (FDCS).

Figure 19:
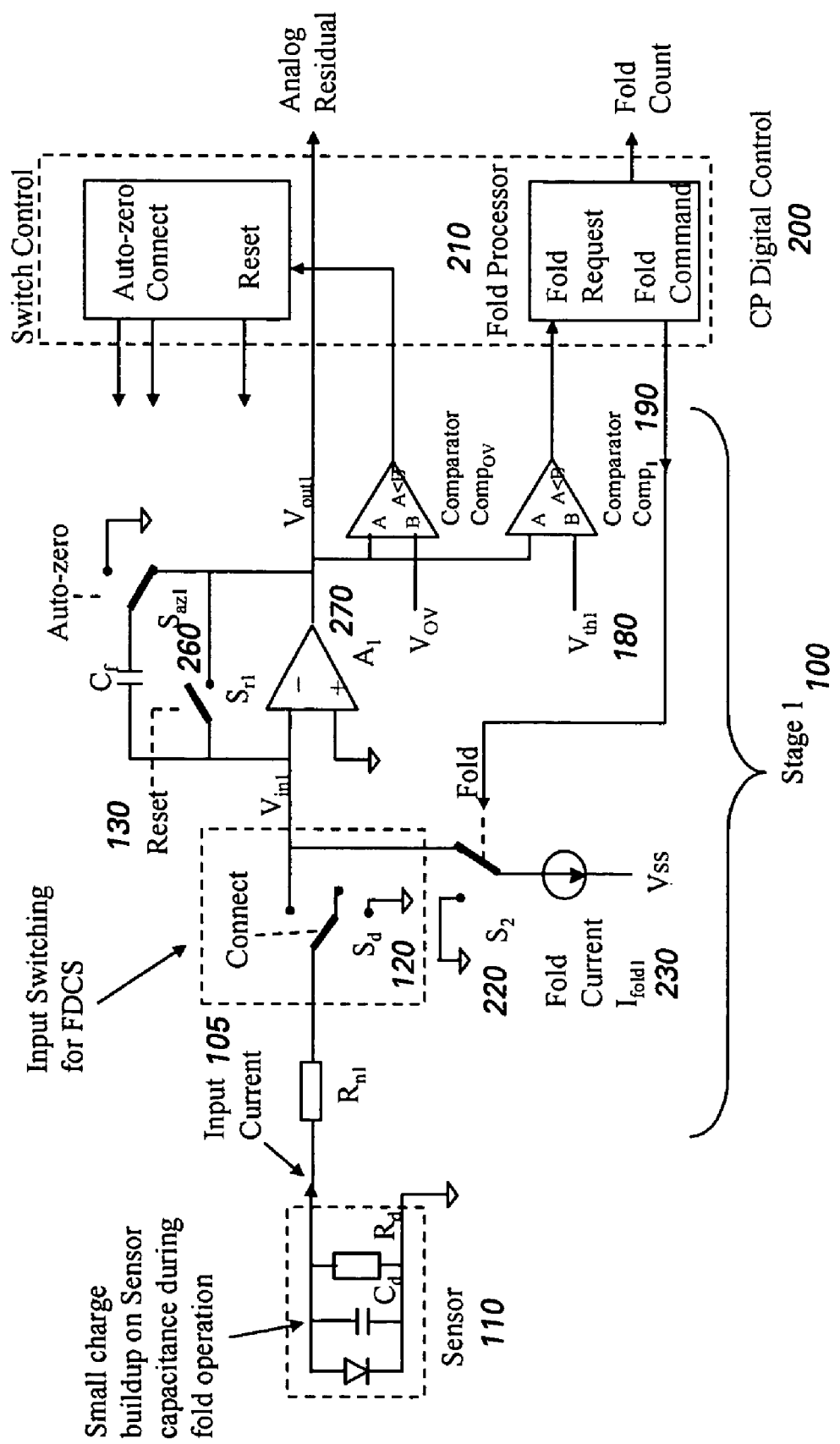
FIG. 19 is a schematic illustration of an embodiment for sensor disconnection circuit applicable to embodiments of the present invention.

The principal of FDCS is to disconnect the sensor from the input stage of the amplifier using the switch in FIG. 19 during the stage 1 folding process. During the time that the sensor is disconnected (the sensor may be disconnected slightly prior to a fold occurring to allow for proper system settling), input charge builds up (due to the capacitive properties of the sensor), and is stored.

Following the fold operation (which may include some additional time required for accurate fold settling) the input sensor will be reconnected to the input stage, and the charge stored upon it is then delivered to the system for processing.

The process of FDCS effectively unloads the first stage of the system from the sensor capacitance presented to it. This allows for the system to settle quicker while folding, essentially allowing for the system to operate at faster speeds for the same power. Alternatively, it allows for less power to be used in the stage 1 amplifier in order to settle in the same amount of time. As a result it can be used as a method to operate at higher speeds, reduce power, or any hybrid combination of the two.

A further benefit of this method is to greatly reduce, and possibly eliminate, the time needed to suspend the charge removal operation (as explained in U.S. Pat. No. 6,366,231). This is possible due to the enhanced (quicker) system settling provided by FDCS, and allows for additional advantages, which include: the potential for a reduction of control circuitry (digital), which leads to reduced power and reduced area; the potential for a faster view time (speed of operation) for a given dynamic input current (charge) range; and, the potential for a larger input current (charge) dynamic range for a given view time (speed of operation).

In a further embodiment, a compensation technique for thermal drift on a charge to digital converter is provided. Typically, in high accuracy charge to digital converters gain and offset drift can cause substantial accuracy problems during operation. These thermal drift components need to be eliminated or compensated. This embodiment presents compensation techniques that correct gain within a multi channel chip (intra-chip), across a group of chips (inter-chip), and offset drift within a multi channel chip. The compensation does not require operation of any input channel to be interrupted at any time.

In a multi-channel charge to digital converter the output digital data can change as a function of temperature. In high accuracy systems, the impact of temperature drift to the measurement must be minimized. Other forms of parameter drift that are not necessarily thermally induced can also be compensated for using this technique.

Figure 20:
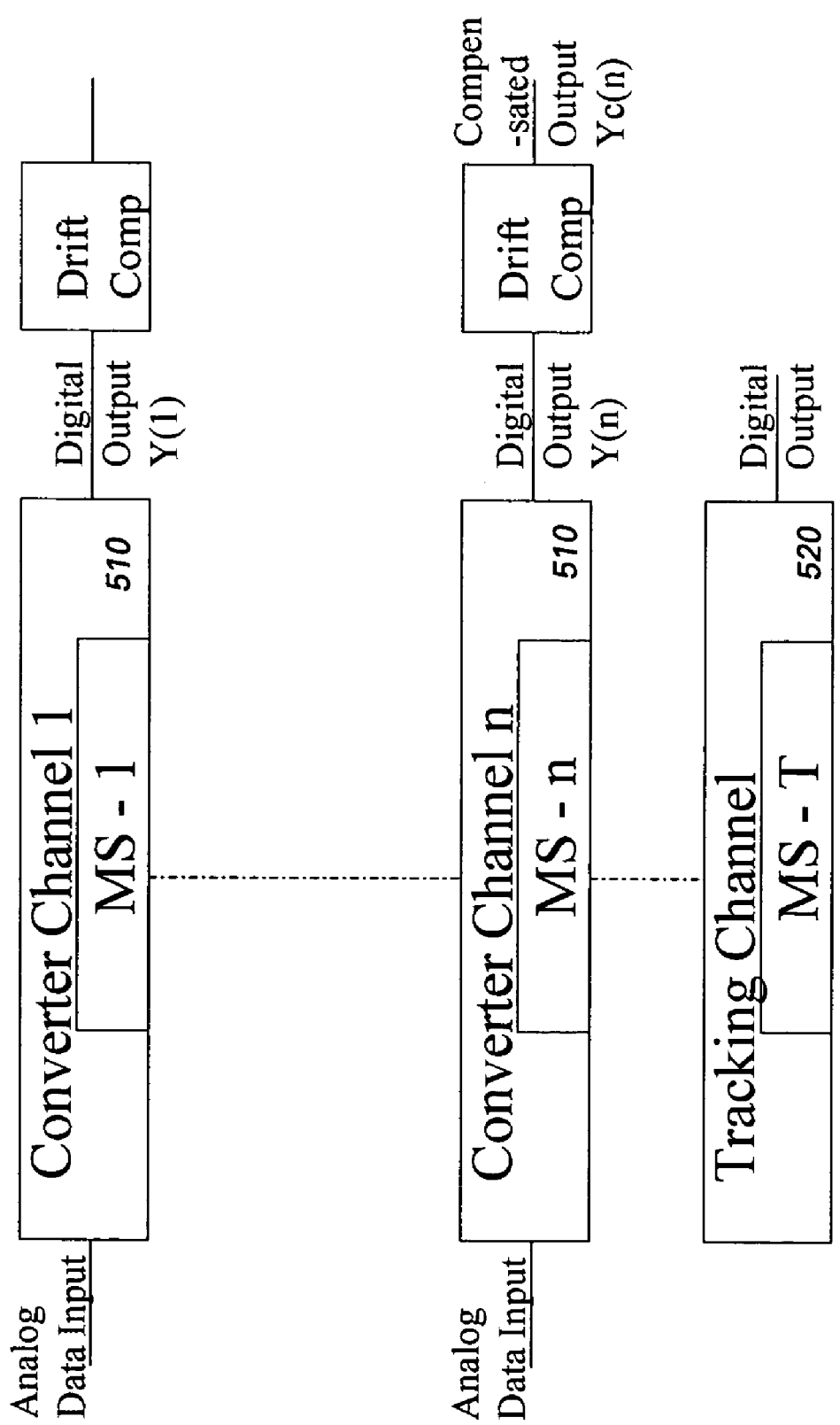
FIGS. 20–25 are schematic illustrations of embodiments of a charge to digital converter with a tracking channel in accordance with embodiments of the present invention.

FIG. 20, shows n channels 510 of analog to digital that are located on one die (assembly 500). The channels simultaneously and continuously measure analog inputs. Each channel contains an element or set of elements that to make up a Measurement Signal MS. The MS is used to compare, subtract, or process the input signal. As described in U.S. Pat. No. 6,366,231 MS refers to a current source. However other measurement signals could include time, voltage, or charge.

Figure 21:
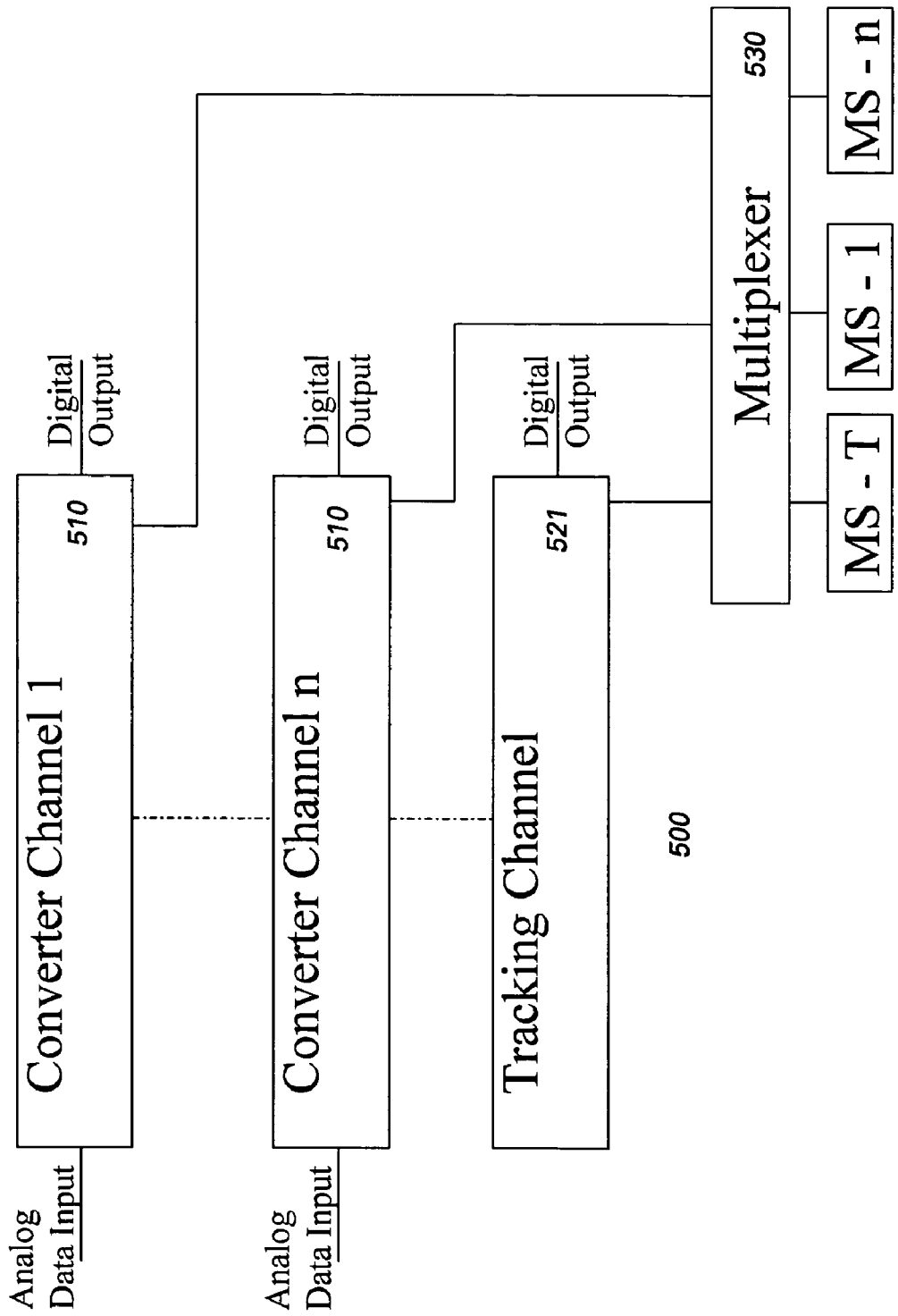

A tracking channel 520 is added to the system. It has its own MS that has the same properties and architecture as the other channels. By having the same architecture, it will have similar thermal properties as the other channels. Data from the tracker channel is used to digitally compensate for thermal drift as shown in FIG. 21.

During operation, the MS for each channel is sequentially swapped with the MS of the tracking channel. By swapping the MS, the other channels can remain in use without interruption. During this period, the tracking channel measures the MS of the channel. This enables the system to have a relative measure of the tracking channel's MS, and the channel's MS. With this information, all data from the n channels can be output in terms of the tracking channels MS.

The MS swapping with the tracking channel is performed with each channel in sequence. Once all channels' MS have been measured by the tracker, the sequence is repeated. As the channels MS drifts in time, the tracking channel captures the MS drifts. Because the output of all channels is transformed into that of the tracking channels MS, any drifts in a channel's MS is compensated. All channels will drift with the tracker, thus achieving intra-chip gain tracking.

An example of this process now follows. During system calibration, a stimulus 'x', is input to the tracker channel. The stimulus is measured by the tracker using the its own MS, and then measured again using the MS of channel 1, then channel 2, until all n channels' MS have been used to measure the stimulus at the tracker. For an n channel converter, there will be n+1 measurements made. The measurement of stimulus x, by the tracker channel, using MSi is given as $Y_T$ (x, MS-i). When the tracker measures its own MS, it outputs $Y_T$ (x, MS-T).

During operation, a channel using its own MS will output Y i (z, MS-i). This is transformed in terms of the tracking channel's MS by:

$$Y_i(z_i, MS\text{-}T) = Y_i(z_i, MS\text{-}i) * Y_T(x, MS\text{-}T)/Y_T(x, MS\text{-}i)$$

Where $z_i$ represents a signal to be converted by channel i. When channel 'i' is using the tracker channels MS, the output of that channel does not require normalizing because its output will be in terms of the tracking channel's MS. As thermal drift causes change in the MS of the channels and the tracker, the compensation system will track this using the equation above.

This scheme has several other advantages that are listed below:

- Drift frequency. This scheme utilizes the fact that other thermal drift of a chip occurs with a relatively slow time constant, generally <10 Hz. In an integrated circuit, it is possible to update the MS measurements (i.e. the ratio $Y_T(,x, MS\text{-}T)/Y_T(x, MS\text{-}i)$) at a rate faster than the thermal drift will change.
- It is possible to divide and conquer using more than one tracking channel. Each tracking channel will monitor a set of channels. The MS's of those tracking channels are then measured with respect to each other. This allows more frequent update of the correction values.
- Noise averaging or filtering can be done to improve the accuracy of the ratio $Y_T(x, MS\text{-}T)/Y_T(x, MS\text{-}i)$. In this case the $Y(x,MS\text{-}I)$ can be averaged over multiple samples, or the ratio itself can be filtered.
- When noise averaging, it is possible to reduce the impact of 1/f noise by averaging across a subset of channels. For the non 1/f compensated case, averaging would be done by finding $Y_T(x, MS\text{-}i)$ across m successive samples. Then averaged. With 1/f compensation of "x", a subset of channels are noise averaged together by reading their $Y_T(x, MS\text{-}i)$ in sequence for each sample, and then averaging once all samples are completed. This has the effect of reading $Y_T(x, MS\text{-}i)$ over a longer period of time.
- Another approach to this problem is to rout the channel inputs to the tracking channel. This requires routing sensitive input signals to one area of the chip. Switch leakage, noise, capacitance are all adversely impacted. The technique used in this disclosure, avoids this problem.
- Changes in tracker stimulus 'x' have small impact on the correction ratio as long as the tracking channels measurement $Y_T(x, MS\text{-}T)$ and a channel's measurement $Y_T(x, MS\text{-}i)$ are made within a period of time that is less than the time constant of the drift mechanism.

Figure 22:
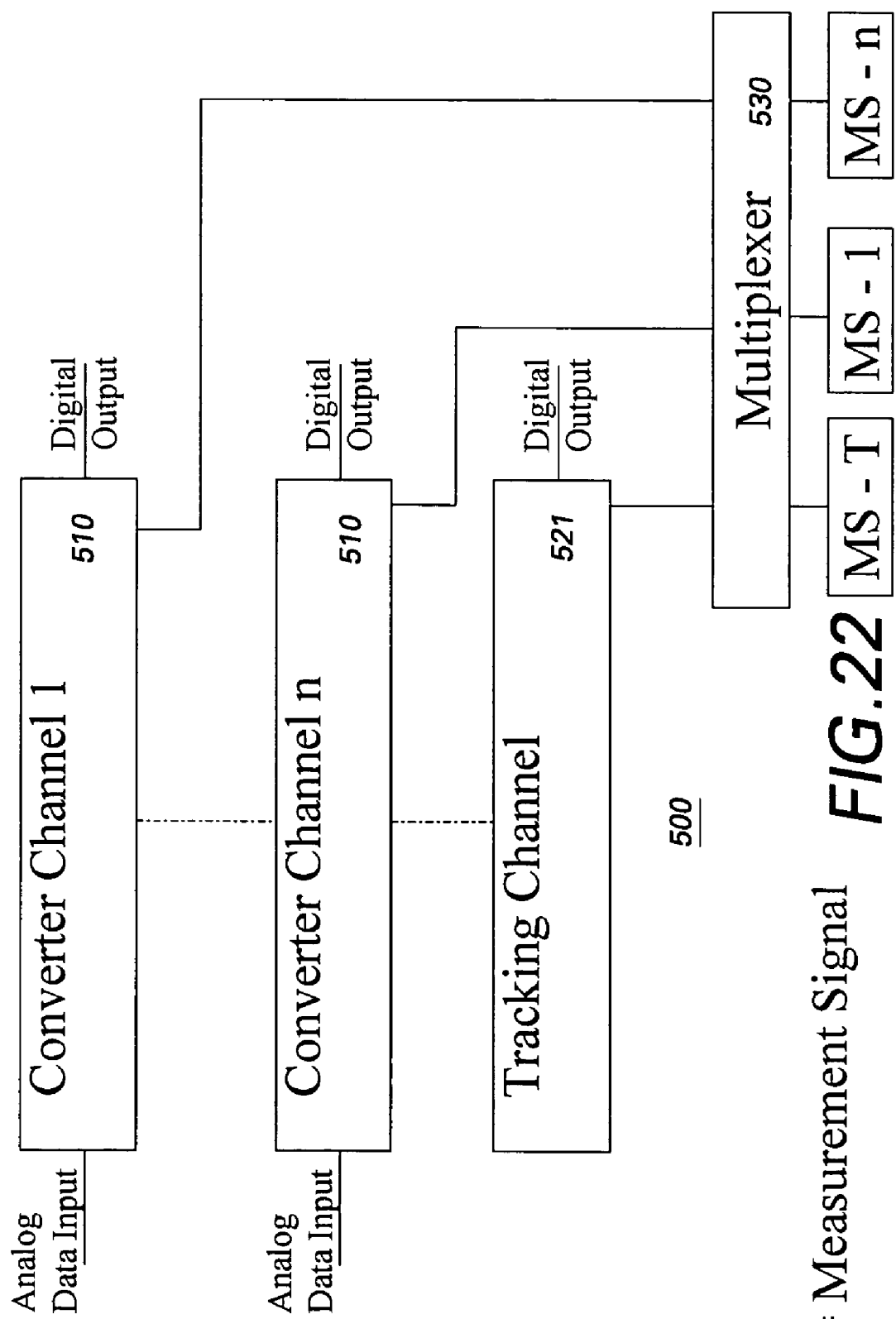

This has been reduced to practice at GE using current sources as an MS. The current sources are swapped using a multiplexer 530 as shown in FIG. 22.

In the case of the current source approach used at GE. The current sources are proportional to gain so that the method compensates for channel gain drift.

In a further embodiment, inter-chip tracking is provided. Inter-chip tracking ensures that referencing all chips to a common MS compensates for differential thermal drift changes.

In the previous section, intra chip tracking introduced a system to compensate for channel's thermal drift by compensating all channels to drift with a tracking channel. The tracking channel can also be used to compensate for gain drift across different chips. In this case, a global MS element that can be input to all chips outputs a stimulus (charge, voltage, time) in sequence. When a chip receives the stimulus, its tracking channel will make a measurement. Once all chips have measured the global MS stimulus, the relative gain each tracking channel can be found by finding the ratio of tracking channel outputs between any two chips.

Figure 23:
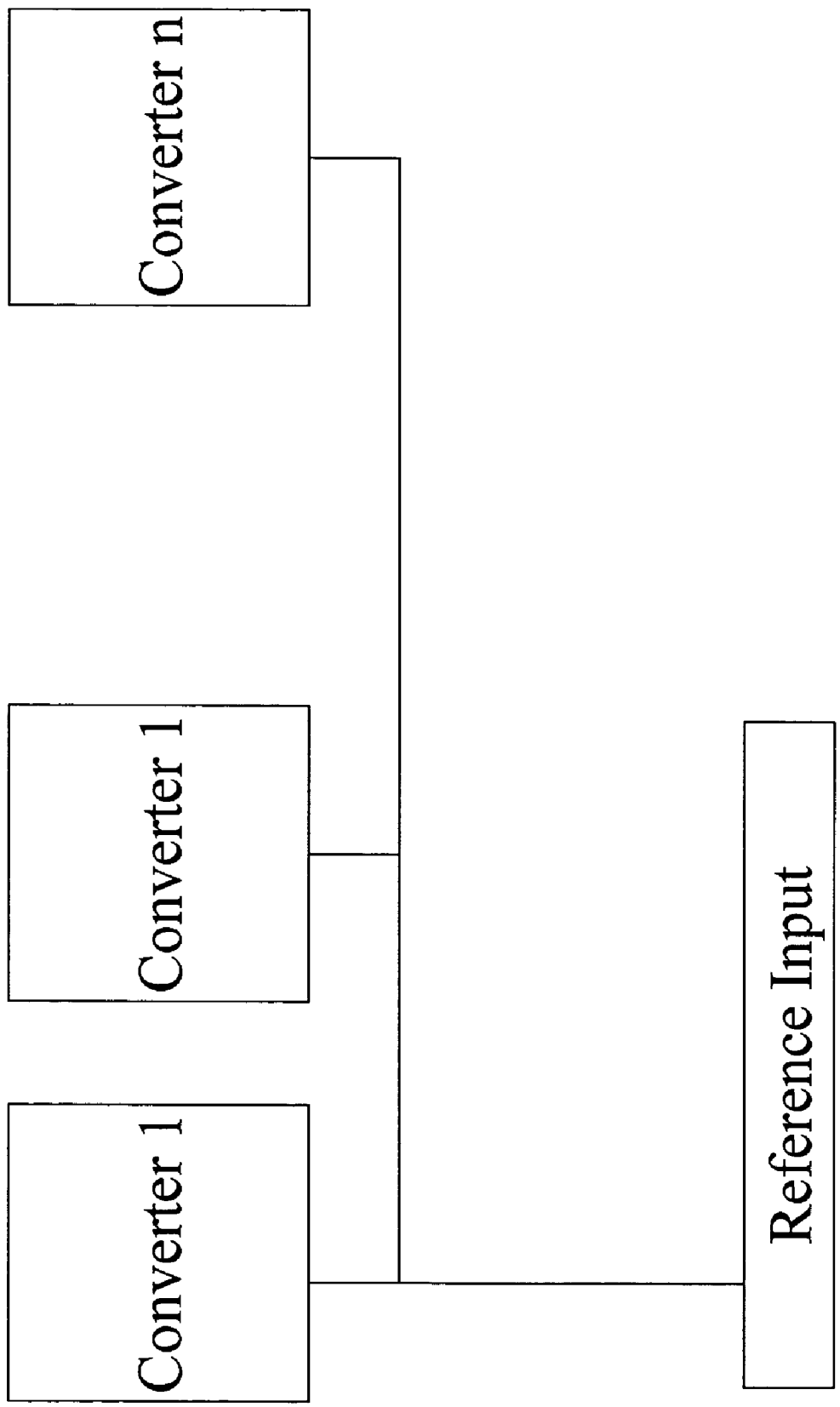
Figure 24:
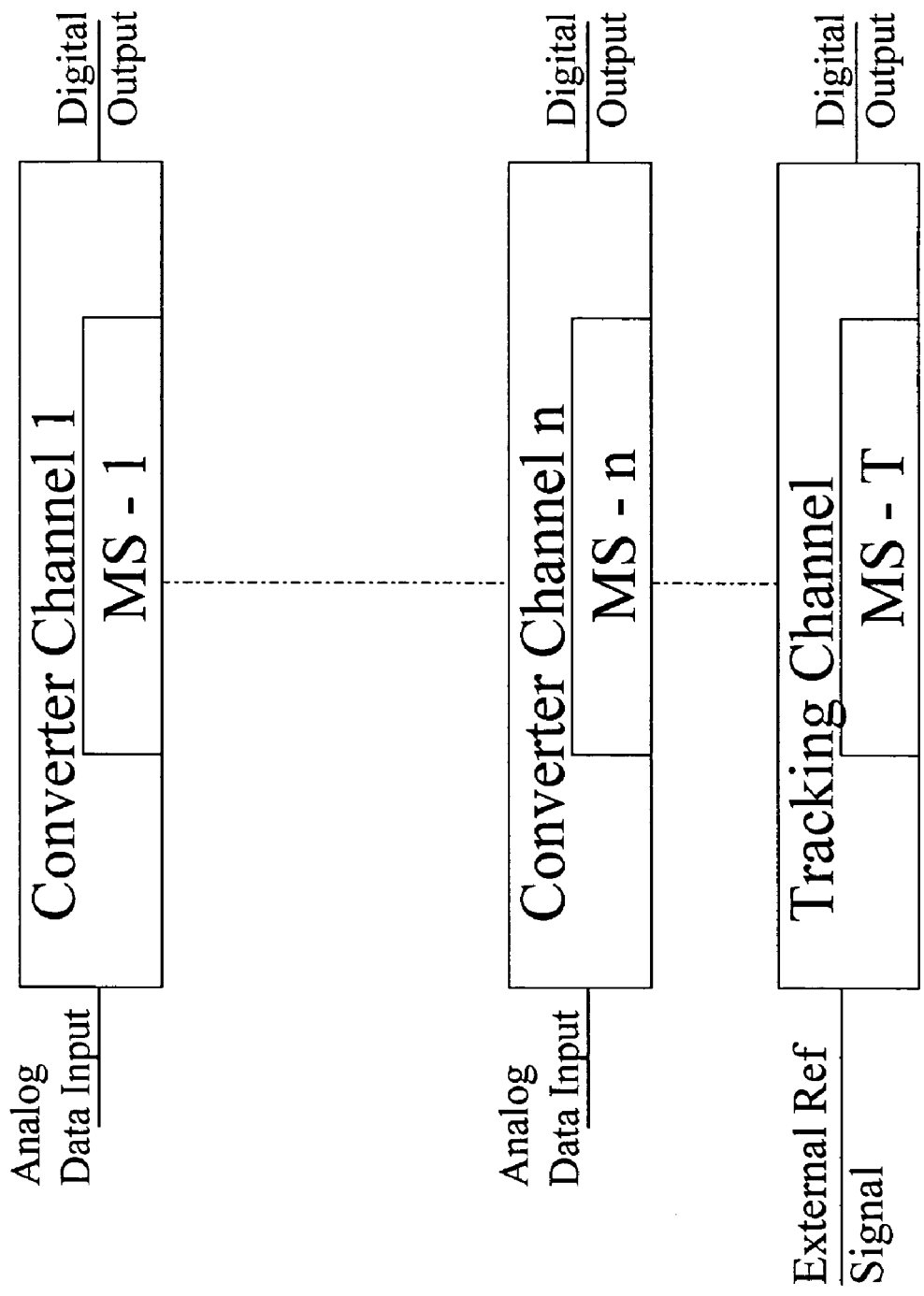

This method requires that all chips can read a stimulus in in the system, as shown in FIGS. 23 and 24. For current based systems, chips should only read the stimulus one at a time. In voltage and time based stimulus, it is possible for all tracking channels to read the global stimulus simultaneously. By using a tracking channel, conversion by the other channels in the system is not interrupted.

Addionally, leakage, or offset drift tracking is desirable. In a system that measures current, uncontrolled changes in leakage currents within the analog to digital converter can be confounded with the actual current that the converter is trying to sense. Electo-Static Discharge (ESD) protection pads are a major contributor to this issue.

ESD pads are used to protect the device during handling, a side effect of this protection structure is a leakage source across reversed biased sensors. Depending on the sensor, leakage will double every 7 to 10 dC of temperature change.

Figure 25:
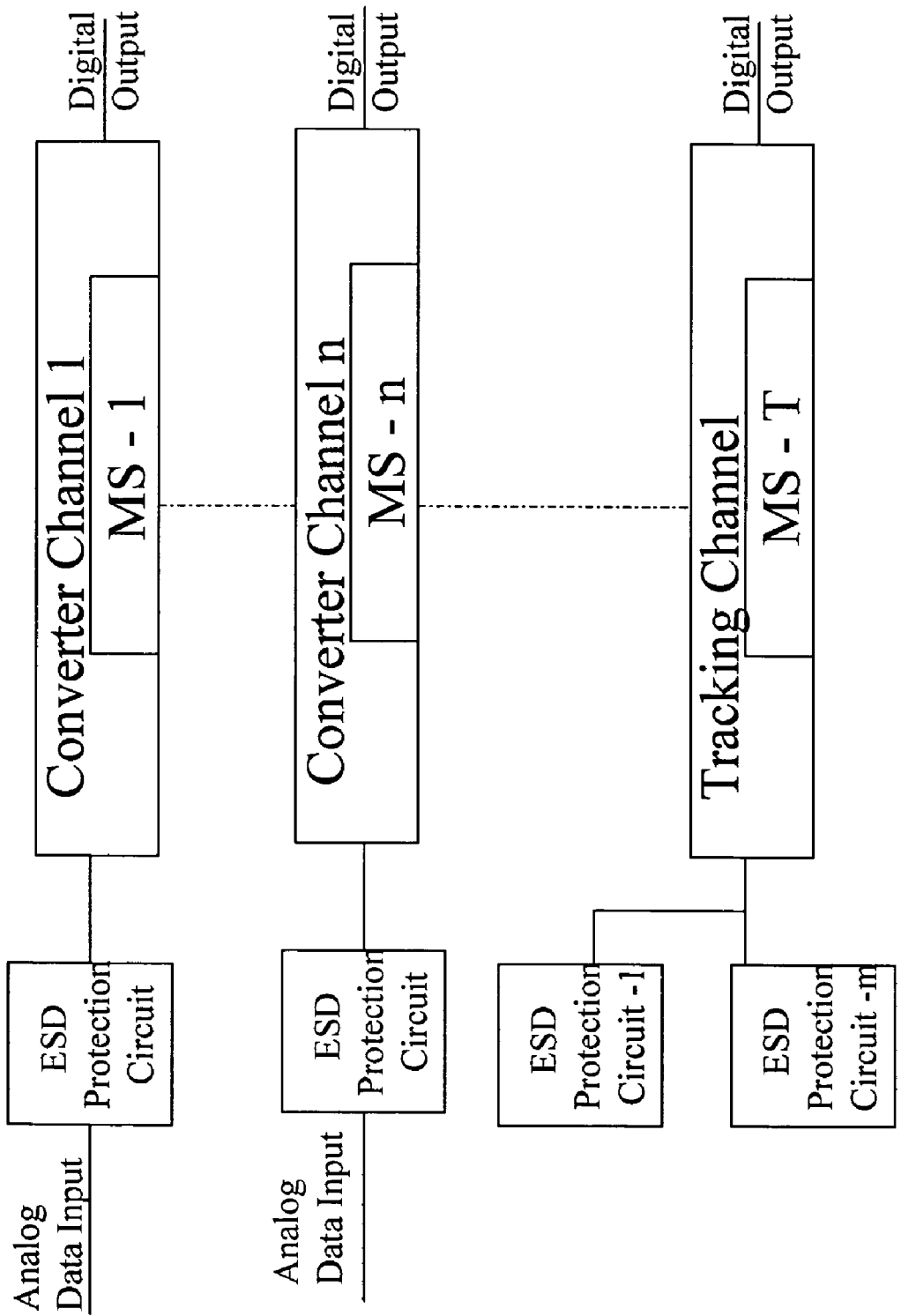

The tracking channel, introduced above, is used to compensate for changes in leakage without interrupting the operation of the other channels. The set-up is shown in FIG. 25. ESD protection circuitry is connected to the input of the tracking channel. These pads are not connected externally. The tracking channel can now measure the leakage current from these pads. Assuming that the die temperature is uniform, the other channels will also experience the same relative change in leakage current of the tracking channel's ESD pads. This data is then used to compensate for leakage changes.

The offset drift correction algorithm compensates for changes in ESD pad current drift due to temperature. This change in current translates to an offset drift in the channel. This underlying assumption in this correction algorithm is that if the tracker leakage current doubles, the leakage current in the channel will double too.

Before operation, after linearization of the channel, the leakage current of each channel is calculated; this leakage current is translated to a leakage charge. During the scan the tracker channel is used in monitor mode sensor mode. In this mode the tracker channel records the changes in charge due to leakage of the pads. Correction is performed on the channel by scaling the leakage charge changes observed in the tracker, to that of each of the channels on the chip.

Calculate Pad Leakage is provided as follows:

1. Measure leakage of each channel. In a charge integration system, this is achieved by integrating the leakage current over different integration times.
2. For each channel (1 to n) find the leakage current due to pads, $I_{leak}$. This is slope of the view time vs counts out data found in 1.
3. For patient scan view time Tv, calculate the offset charge due to leakage current at each channel at the initial temperature T1.

$$Q_{l,chan}^{T1} = T_v \cdot I_{leak,chan}^{T1}$$

4. For each channel and the tracker, calculate the proportion of the channel offset that is not caused by leakage current, $Q_{base,chan}^{T1}$.

$$Q_{base,chan}^{T1} = Q_{offset,chan}^{T1} - Q_{l,chan}^{T1}$$

$$Q_{base,tracker}^{T1} = Q_{offset,tracker}^{T1} - Q_{l,tracker}^{T1}$$

It should be noted that an assumption of the algorithm is that this component, due to cal injections, charge injection in the channel, does not vary significantly with temperature and where T1 represents data taken at the initial calibration temperature before scan.

Figure 26:
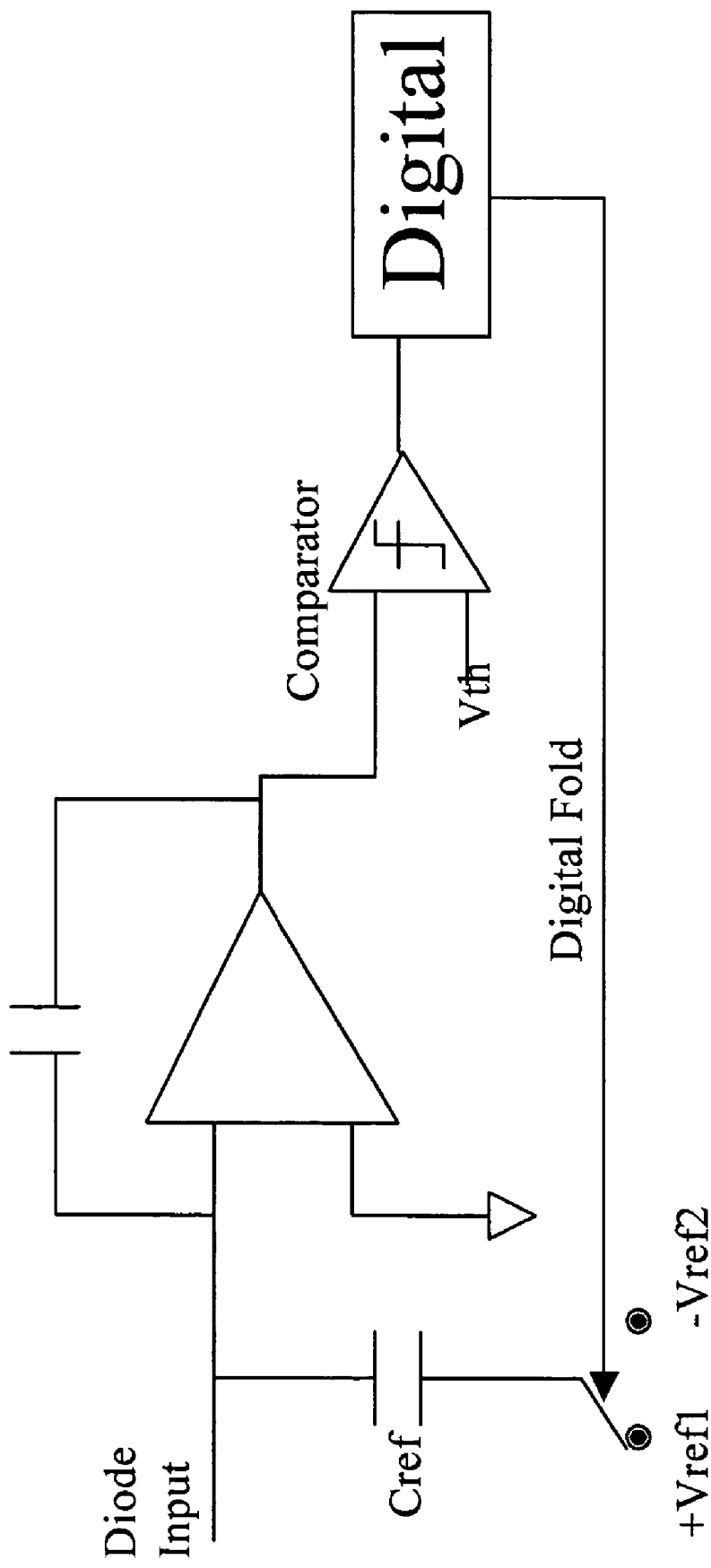
FIGS. 26–28 are schematic illustrations of charge subtracting circuits applicable to embodiments of the present invention; and, FIG. 29 is a schematic illustration of a self-test for sensor electronics useful in embodiments of the present invention.
Figure 27:
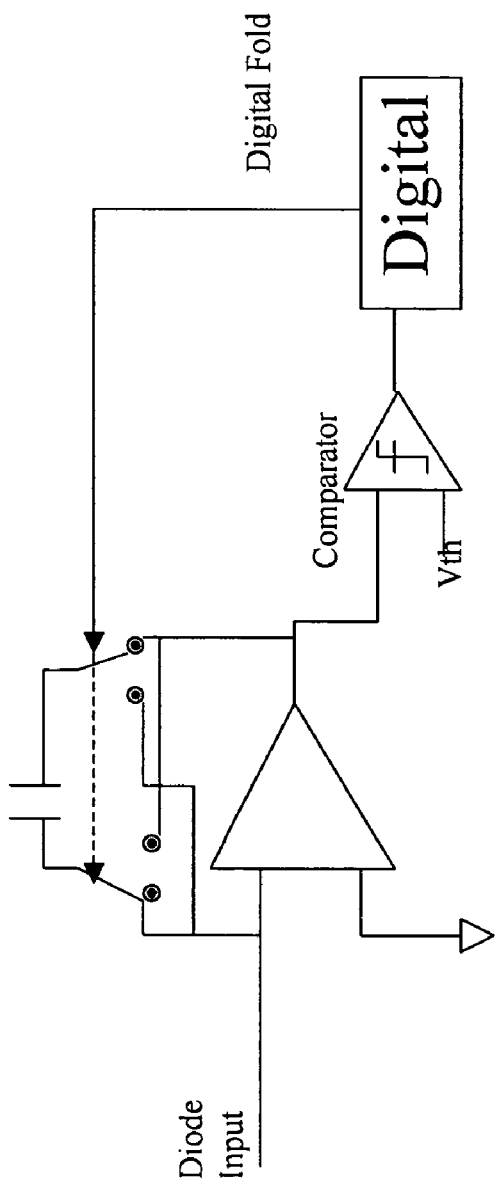
Figure 28:
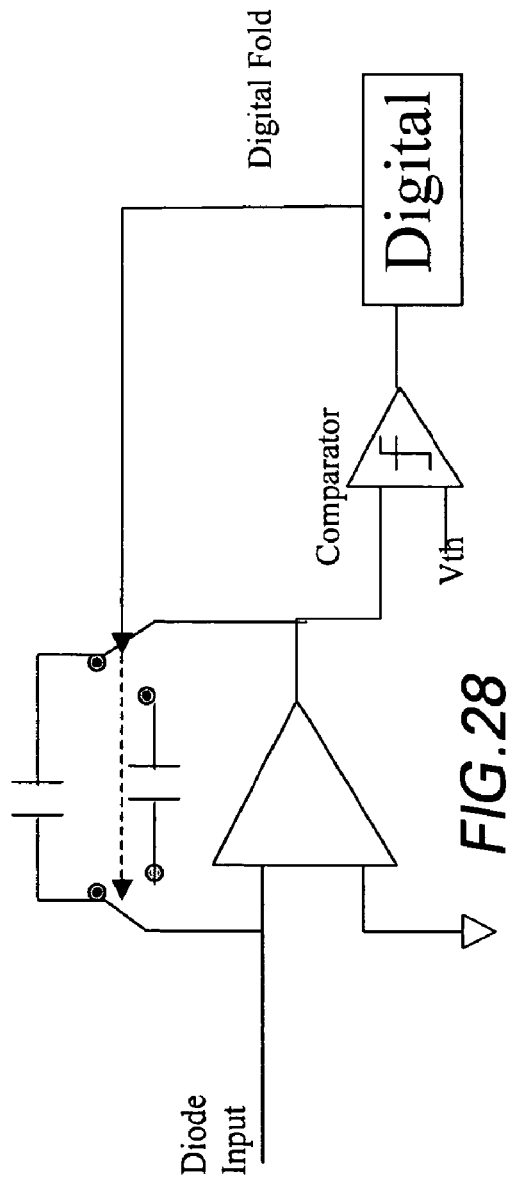

Referring now to FIGS. 26–28, charge subtracting circuits are provided using a reference capacitor and voltage reference. In U.S. Pat. No. 6,366,231, charge subtracting using a current source and clock is described. In a further embodiment, charge subtracting circuit comprises a reference capacitor and voltage reference as shown in FIG. 31. Alternatively, referring to FIG. 27, a charge subtracting circuit comprises rotation of an integration capacitor. Another alternative is shown in FIG. 28 where a charge subtracting circuit comprises a ping-pong capacitor.

Figure 29:
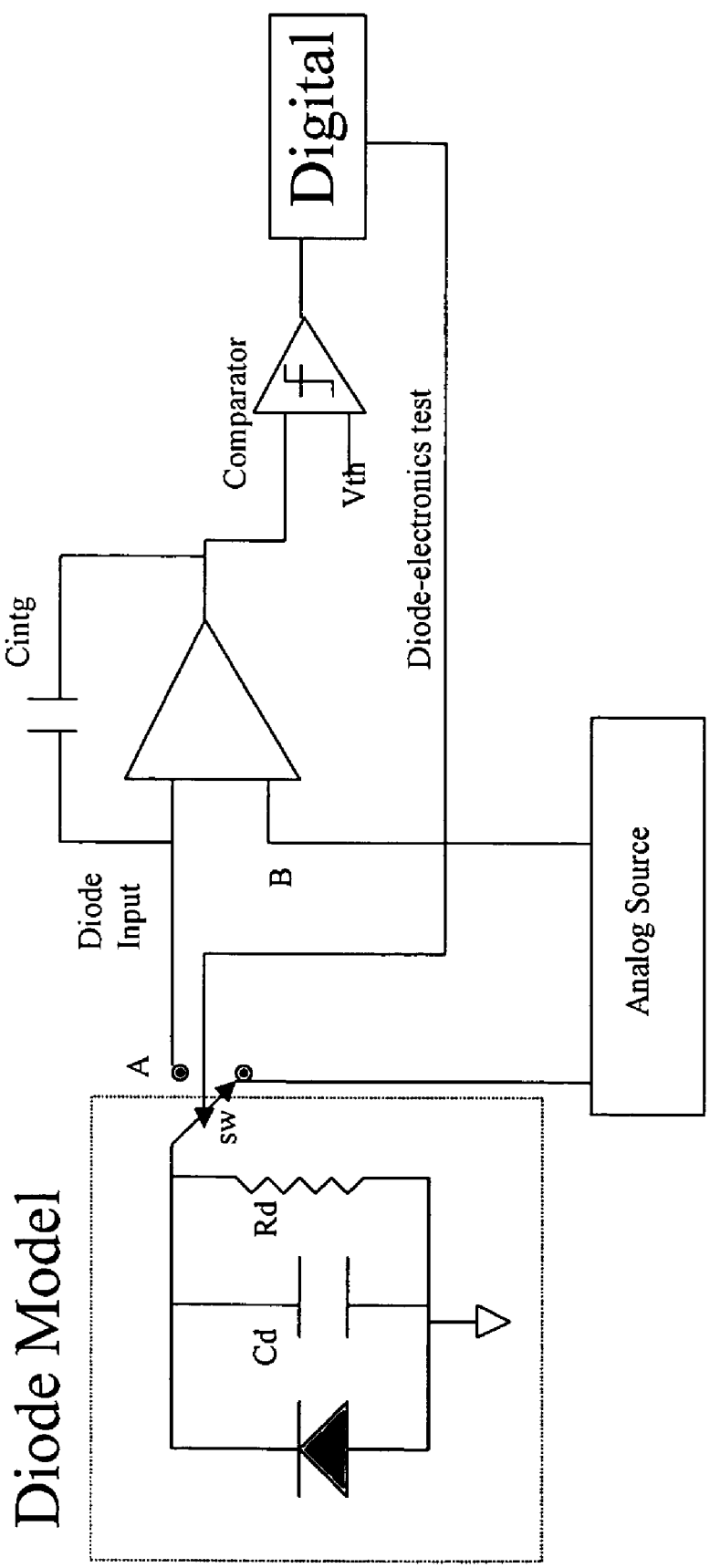

Referring now to FIG. 29, a self-test for sensor-electronics interface is shown. It is to be appreciated that in a typical charge sensor system, there can be several thousand sensor-electronic interface connections. There is a need to test and characterize sensor-electronics interfaces without radiation for reliability, ease of use, safety, cost and system life considerations. In the circuit shown in FIG. 29, the analog source could be either voltage, current or charge. The sensor can be modeled as a parallel combination of Cd and Rd. By detecting the presence and value of Cd or Rd, the sensor-electronic interface can be tested. The sensor capacitance, Cd is charged by the analog source. When the switch, sw, transitions to node A, it is discharged into the feedback capacitor Cintg which then digitized to evaluate the sensor-electronic interface. The sensor capacitance, Rd, is evaluated by closing the switch, sw to node A and applying a voltage on node B. Node A will track node B by principle of virtual ground and impose a voltage on Rd. The current through Rd is integrated by the integration capacitor, Cintg and digitized.

In a further embodiment, a "telescopic" linearization algorithm for circuit comprising a plurality of charge-to-digital converters is now described. In this embodiment, the algorithm uses internally generated calibration currents to determine the input-referred stage-count size (coefficient) for each of the four stages of every pipelined channel. The key benefit of this algorithm is that it is fast and accurate. It is used in concert with separate channel-offset and channel-gain (air-cal) measurements to completely characterize the channel charge-to-count transfer function for use during patient scanning.

In an exemplary embodiment, a global digital data acquisition system (GDAS) integrated chip is used and comprises 64 channels and each channel is a four-stage pipelined charge-to-digital converter. Each stage in a channel processes its input charge (for a given view) by sequentially removing fixed-size "teaspoons" until only a small residual charge is left. The residual charge is then amplified (voltage copied to a larger capacitor) and processed by the following stage (except for stage 4). Each teaspoon removal is called a "fold," and each stage produces a fold count for each view. The final "channel count" or charge value for a given channel and view period is determined by summing the fold charges removed by all stages. The fold charge removed at each stage is just the product of the fold count and "charge-per-fold" for that stage. Complete linearization of a channel amounts to determining the input-referred (stage-1) charge-per-fold or "coefficient" for each stage in the channel.

Telescopic linearization uses well-chosen internally injected charge values to 1) simplify the coefficient solution mathematics, 2) improve robustness of the solution, and 3) reduce the time (amount of view averaging) required for a given coefficient accuracy.

Channel linearization is now described. Once a channel has been linearized, the linearization coefficients are stored and used with subsequently observed stage counts $N_1$ through $N_4$ to calculate the channel input-charge for each integration period (view) using equation (1) below:

$$Q_{in} = \alpha_1(N_1-N_{1os}) + \alpha_2(N_2-N_{2os}) + \alpha_3(N_3-N_{3os}) + \alpha_4(N_4-N_{4os}). \quad (1)$$

Here $\alpha_1$, $\alpha_2$, $\alpha_3$, and $\alpha_4$ are the stage-1 input-referred coefficients or charge-per-fold for stage 1–4, respectively. Furthermore, $N_{1os}$, $N_{2os}$, $N_{3os}$, and $N_{4os}$ are the stage "offset" counts, i.e., the stage counts observed when $Q_{in}$ is forced to zero or to some other reference (e.g., sensor leakage charge with zero Charge sources). For our purposes, $\tilde{Q}_{in}$ represents a charge that is being estimated. When the charge is known a-priori, $Q_{in}$ (no tilde) is used.

A channel is linearized by sequentially applying known charges to the input, and then using the resulting stage counts to solve for the stage coefficients and offsets that yield the most accurate input-output transfer curve. Channel linearization is simplified by decomposing it into the following steps:

1) Find the stage-coefficient ratios that yield a straight line for the charge-to-digital transfer curve.
2) Determine the offset of the straight-line transfer curve.
3) Determine the channel gain or slope of the straight-line transfer curve.

Step 1 is accomplished by rewriting (1) as $$Q_{in} = \alpha_1\left[N_1 + \frac{\alpha_2}{\alpha_1}\left(N_2 + \frac{\alpha_3}{\alpha_2}\left\{N_3 + N_4\frac{\alpha_4}{\alpha_3}\right\}\right)\right] - Q_{os}. \quad (2)$$

Here, $Q_{in}$ will be a known input charge. Furthermore, $Q_{os}$ is the input-offset charge seen in (1) above as $$Q_{os} = \alpha_1 N_{1os} + \alpha_2 N_{2os} + \alpha_3 N_{3os} + \alpha_4 N_{4os}. \quad (3)$$

Initially, this offset is unknown but constant. Equation (2) can be further re-written as $$Q_{in} = \alpha_1[N_1 + R_{21}(N_2 + R_{32}\{N_3 + R_{43}N_4\})] - Q_{os}, \quad (4)$$

where $R_{21} = \alpha_2/\alpha_1$ is the stage 2-stage 1 alpha ratio, etc. The channel is linearized by using the telescopic algorithm to solve for the stage alpha ratios, then measuring the channel offset, $Q_{os}$ (or the equivalent stage counts), and finally establishing the channel "gain" by measuring $\alpha_1$.

In the production IC, all channels will be linearized simultaneously and then operated simultaneously. When using the channel to estimate sensor charge, the linearity error is required to meet the following bounds:

$$|Q_T - \beta\tilde{Q}_{in}| < \pm(0.285 \text{ fC} + 2*10^{-4}Q_T). \quad (5)$$

Here $Q_T$ is the true input charge value, $\tilde{Q}_{in}$ is the calculated charge, and $\beta$ is a constant gain error that is allowed to be between 0.9 and 1.1. Equation (5) says that the channel input-output transfer function should be a "very straight line" but the absolute gain may be wrong by up to +/−10%.

Steps 2 (offset) and 3 (gain) are, for now, assumed to be well understood. For example, the GDAS electronics-only offset is measured by disconnecting stage 1 of all channels from their associated input pads, and then measuring the average stage counts in each channel. Offset with just GDAS pad leakage (no sensor leakage) is measured by opening the FET switch in the sensor module, connecting each stage 1 to its input pad, and measuring the average stage counts in each channel. Offset with sensor leakage is measured by repeating the process with the FET switch closed.

Channel gain is measured by exciting all channels with a known (either absolute or relatively, channel-to-channel) large charge value that causes many stage-1 folds, collecting average stage counts over a number of views, and then using the average stage counts with the known coefficient ratios, offset counts, and input charge to solve for $\alpha_1$ in equation (4).

The channel gain and offset are expected to vary with temperature. To deal with this, the ASIC includes a tracker channel to monitor the gain and the offset drift while actively scanning.

Telescopic linearization is now described. With the telescopic method, the coefficient ratio for any two adjacent stages is found by driving the earlier stage with three well-chosen internal charge values and calculating the ratio from the three resulting counts. Using this scheme, coefficient ratio $R_{43}$ is determined first, then coefficient ratio $R_{32}$ is determined, and then coefficient ratio $R_{21}$ is determined. This means a total of 9 different "measurements" (three for each stage ratio) are needed.

It should be noted that the equations below make reference to stage counts and injected charge values. The following notation is used to distinguish the stage-of-injection, the stage of interest, and the index of the injected charge value.

Injected charge values are $Q_Z^W$, average stage counts are $N_{YZ}^W$, and composite stage counts are $C_{XZ}^W$. The subscripts and superscripts are as follows:
   W=stage where injection is done.
   Y=observed stage.
   Z=index of the injected charge.
   X=first stage of the composite stage sequence.

Calculated stage coefficients are $\alpha_J$ or $\alpha_{KP}$, and the subscripts are as follows:
   J=stage whose counts are to be multiplied by the $\alpha_J$ when calculating charge.
   K=stage where injection is done.
   P=Stage after the injection stage (K+1).

The stage 3–4 linearization mathematics are now described. With the telescopic method, $R_{43}$ of equation (4) is first determined. To do this, stage 3 is disconnected from stage 2 and the resulting two-stage (3–4) A/D converter is linearized using three different injected-charge values at the input of stage 3. For each injected charge value, the stage-3 and stage-4 counts are collected for multiple views. From the multiple-view data, the average stage-3 and average stage-4 counts are calculated (sum divided by number of views). By choosing the injected charge values well, $R_{43}$ is readily determined with a single equation.

For stage 3–4 linearization, let the three stage-3 injected-charge values be defined as $Q_1^3$, $Q_2^3$, and $Q_3^3$. The value for charge i is $Q_i^3$, and it is specified by a fixed-charge pulse, $Q_{pulse}^3$, and an integer number of pulses or "grids", $G_i^3$. The three different charges are then $Q_1^3 = G_1^3 Q_{pulse}^3$, $Q_2^3 = G_2^3 Q_{pulse}^3$, and $Q_3^3 = G_3^3 Q_{pulse}^3$.

For each injected charge value, the charge and stage counts are related by $$\frac{Q_i^3}{\gamma_{13}} = \alpha_3 N_{3i}^3 + \alpha_4 N_{4i}^3 + O_{34}, \text{ for } i = 1, 2, 3. \tag{6}$$

Here $\gamma_{13}$ is the constant but unknown charge amplification from the input of stage 1 to the input of stage 3. This factor will soon disappear, but is needed here because the alpha values are defined with respect to the input of stage 1. Also, $O_{34}$ is a constant but unknown charge error or offset associated with stage-34 injections. But (6) can be rewritten as $$\frac{Q_i^3}{\gamma_{13}\alpha_3} - \frac{O_{34}}{\alpha_3} = N_{3i}^3 + R_{43} N_{4i}^3, \text{ for } i = 1, 2, 3, \tag{7}$$

or $$\frac{G_i^3 Q_{pulse}^3}{\gamma_{13}\alpha_3} - \frac{O_{34}}{\alpha_3} = N_{3i}^3 + R_{43} N_{4i}^3, \text{ for } i = 1, 2, 3. \tag{8}$$

The conditions that reduce equations (8) to a single equation are:

$$N_{31}^3 = 0,\ N_{32}^3 = 0,\ \text{and}\ N_{33}^3 > 0, \text{ for stage 3}, \tag{9a}$$

and $$N_{41}^3 > 0,\ N_{42}^3 > N_{41}^3,\ \text{and}\ N_{43}^3 > 0 \text{ for stage 4}. \tag{9b}$$

Under these conditions, equations (8) show the three input charges, associated stage counts, and the coefficient ratio are related by $$\frac{G_1^3 Q_{pulse}^3}{\gamma_{13}\alpha_3} - \frac{O_{34}}{\alpha_3} = R_{43} N_{41}^3, \text{ for } i = 1 \tag{10}$$

$$\frac{G_2^3 Q_{pulse}^3}{\gamma_{13}\alpha_3} - \frac{O_{34}}{\alpha_3} = R_{43} N_{42}^3, \text{ for } i = 2 \tag{11}$$

and $$\frac{G_3^3 Q_{pulse}^3}{\gamma_{13}\alpha_3} - \frac{O_{34}}{\alpha_3} = N_{33}^3 + R_{43} N_{43}^3, \text{ for } i = 3. \tag{12}$$

Subtracting (10) from (11) removes the unknown offset and yields $$(G_2^3 - G_1^3)\frac{Q_{pulse}^3}{\gamma_{13}\alpha_3} = R_{43}(N_{42}^3 - N_{41}^3). \tag{13}$$

Similarly, subtracting (10) from (12) yields $$(G_3^3 - G_1^3)\frac{Q_{pulse}^3}{\gamma_{13}\alpha_3} = N_{33}^3 + R_{43}(N_{43}^3 - N_{41}^3). \tag{14}$$

Finally, dividing (14) by (13) removes the dependence on $\gamma_{13}$, and $\alpha_3$, and $Q_{pulse}^3$, and solving for $R_{43}$ yields $$R_{43} = N_{33}^3 \Big/ \left[\frac{G_3^3 - G_1^3}{G_2^3 - G_1^3}(N_{42}^3 - N_{41}^3) - (N_{43}^3 - N_{41}^3)\right]. \tag{15}$$

In equation (15), the stage counts associated with each injected charge are average values taken over a number of views using that injected charge value. The averaging reduces noise. To reduce the effective stage-4 step size and further improve linearization-coefficient accuracy, ten different "dither" views are used in stage 4 for each stage-3 injected charge. Each dither view uses a different stage-4 injection value. The ten different dither injections are 0, 1, 2, 3, 4, 5, 6, 7, 8, and 9 stage-4 injection pulses, with each pulse having a single 1-tic (50 ns) width. Ten dither steps are used to insure that an entire stage-4 step is spanned by the dither range. This choice effectively reduces the stage-4 step size (for linearization purposes only) by a factor of 10. For accurate results, the stage counts for each stage-3 injected charge are average values taken over an integer number of 10-view "dither cycles".

The ASIC internal "cal" current sources may have low frequency "1/f" noise that causes each measured count in (15) to have variation that simple averaging doesn't properly reduce. To eliminate the effect of this 1/f noise in the resulting alpha ratios, the three associated injection levels should be "view-stirred" for each stage ratio. This means that the three different injection values should be used in three time-adjacent views with the first dither value, then the same three injection values should be used in the next three time-adjacent views with the second dither value, etc. In this way, any slow variation in the underlying injection current source will equally affect all three count results. As can be seen in equation (15), if stage-4 counts $N_{41}$, $N_{42}$, $N_{43}$, and $N_{33}$ all increase by 2% (due to slow variation or 1/f noise), the ratio remains unchanged.

The 3-view stirring method has been used with 10 stage-4 dither steps to create a 30-view "stirred-dither" cycle for stage 3–4 ratio measurement. The charge-pulse value and number of grids used for the stage-3 injections are $Q_{pulse}^3$ 32 200 fC, $G_1^3=1$, $G_2^3=4$, and $G_3^3=110$, as was shown in Table 1. Each of the stage 3–4 counts was separately averaged over 32 stirred-dither cycles, and then used in (15). This was repeated a large number of times over several hours and the observed variation of $R_{43}$ was only 450 ppm. This is a very satisfactory amount of variation because stage 3–4 error is the dominant error only when there are no stage-1 or stage-2 folds, there is only one stage-3 fold, and there are a large number of stage-4 folds. The largest stage-1 input charge where this is true is approximately 12 fC, and the linearity budget is +/−0.285 fC for input charge values in this range. See that 450 ppm of 12 fC is roughly 0.005 fC, and this is much smaller than the 0.285 fC error allowance. Using this method the stage 3–4 ratio was determined using 32×30=960 views, but the number of 30-view dither cycles can probably be reduced from 32 to only 8 with little growth in the $R_{43}$ variation.

Stage 2–3 linearization mathematics are now described. The stage 2–3 coefficient ratio, $R_{32}$ in equation (4), is found in a manner very similar to that for $R_{43}$. During the charge injection in stage 2, Stages 2 and 3 are reconnected but stage 2 is disconnected from stage 1. The resulting three-stage (2–4) A/D converter is linearized using three injected-charge values in stage 2. For each injected charge value, the stage-2, stage-3, and stage-4 counts are again collected for multiple views. From the multiple-view data, the average stage-2, stage-3, and average stage-4 counts are calculated. Using these average stage counts with the already known stage 3–4 coefficient ratio, the stage 2–3 coefficient ratio is calculated.

The three stage-2 injected-charge values are $Q_1^2$, $Q_2^2$, and $Q_3^2$. Again, these charges are specified by a pulse width, $Q_{pulse}^2$, and a number of pulses, $G_i^2$, injected during the view. The stage-2 injection current is 1 uA and the three charge values are $Q_1^2=G_1^2 Q_{pulse}^2$, $Q_2^2=G_2^2 Q_{pulse}^2$, and $Q_3^2=G_3^2 Q_{pulse}^2$. The injected pulse width and number of injected grids are chosen so that the composite counts from stages 3 and 4 satisfy $$N_{21}^2=0,\ N_{22}^2=0,\ \text{and}\ N_{23}^2>0,\ \text{for stage 2,} \tag{16a}$$

and $$C_{31}^2>0,\ C_{32}^2>C_{31}^2,\ \text{and}\ C_{33}^2>0\ \text{for stage 3–4.} \tag{16b}$$

Here $$C_{3i}^2 = N_{3i}^2 + R_{43} N_{4i}^2,\ i=1,\ 2,\ 3, \tag{17}$$

is the composite count from stages 3 and 4 for the i'th injected charge. Note that the previously calculated $R_{43}$ is used in (17). Following a development like that of equations (6) through (14), and utilizing the constraints of (16a) and (16b) yields $$R_{32} = N_{23}^2 \bigg/ \left[ \frac{G_3^2 - G_1^2}{G_2^2 - G_1^2} (C_{32}^2 - C_{31}^2) - (C_{33}^2 - C_{31}^2) \right]. \tag{18}$$

The stage 2–3 coefficient-ratio accuracy is improved by again using dither injections in stage 4, and by stirring the three different stage-2 injection to combat 1/f noise in the calibration current sources. Because the stage-2 coefficient is less sensitive to effective the stage-4 step size, only 5 different dither values are used in stage 4 for each stage-2 injected charge. The five different dither injections are 0, 2, 4, 6, and 8 stage-4 injection pulses, with each pulse having a single 1-tic (50 ns) width. The five dither steps span the stage-4 step size so that the average of 5 differently dithered views will yield stage-4 counts with a resolution of ⅕ of a step. For accurate results, the stage counts for each stage-2 injected charge are again averaged over an integer number of 5-view "dither cycles".

The 3-view stirring method has been used with 5 stage-4 dither steps to create a 15-view "stirred-dither" cycle for stage 2–3 ratio measurement. The stage-2 and stage 3–4 counts will satisfy (16a) and (16b) if the stage-2 injection pulse width is $Q_{pulse}^2=600$ fC and the three stage-2 injection values are $G_1^2=0$, $G_2^2=4$, and $G_3^2=110$. These were shown in Table 1. Each stage counts was separately averaged over 64 stirred-dither cycles and then used in (18). This was repeated a large number of times over several hours and the observed variation of $R_{32}$ was only 50 ppm. This is a very satisfactory amount of variation because stage 2–3 error is most important when there are no stage-1 folds, there is only one stage-2 fold, and there are a large number of stage-3 folds. The largest stage-1 input charge where this is true is approximately 0.26 pC, and the linearity budget is +/−0.285 fC for input charge values in this range. See that 50 ppm of 0.26 pC is only 0.013 fC and this error is much less than the 0.285 fC error allowance. Using this method the stage 2–3 ratio was determined using 64×15=960 views, but the number of 15-view dither cycles can probably be reduced from 64 to only 16 with little growth in $R_{32}$ variation.

Stage 1–2 linearization mathematics is now described. The stage 1–2 coefficient ratio, $R_{21}$ in equation (4), is found in the same manner used for $R_{32}$. During the charge injection in stage 1 all stages are connected but stage 1 is disconnected from its input pad. The four-stage A/D converter is linearized using three injected-charge values in stage 1. For each injected charge value, stage-1, stage-2, stage-3, and stage-4 counts are collected for multiple views. From the multiple-view data, the average stage-1, stage-2, stage-3, and stage-4 counts are calculated. Using these average counts with the already known stage 2–3 and stage 3–4 coefficient ratios, the stage 1–2 coefficient ratio is calculated.

The three stage-1 injected-charge values are $Q_1^1$, $Q_2^1$, and $Q_3^1$. These charges are specified by a pulse width, $Q_{pulse}^1$, and a number of pulses, $G_i^1$, injected during the view. The stage-1 injection current is 2 uA and the three charge values are $Q_1^1 = G_1^1 Q_{pulse}^1$, $Q_2^1 = G_2^1 Q_{pulse}^1$, and $Q_3^1 = G_3^1 Q_{pulse}^1$. The injected pulse width and number of injected grids are chosen so that the composite counts from stages 2, 3 and 4 satisfy $$N_{11}^1 = 0, N_{12}^1 = 0, \text{ and } N_{13}^1 > 0, \text{ for stage 1}, \quad (19a)$$

and $$C_{21}^1 > 0, C_{22}^1 > C_{21}^1, \text{ and } C_{23}^1 > 0 \text{ for stages 2, 3, and 4}. \quad (19b)$$

Here $$C_{2i}^1 = N_{2i}^1 + R_{32}(N_{3i}^2 + R_{43}N_{4i}^2), i = 1, 2, 3, \quad (20)$$

is the composite count from stages 2, 3 and 4 for the i'th injected charge. Note that the previously calculated $R_{32}$ and $R_{43}$ are used in (20). Following a development like that of equations (6) through (14), and utilizing the constraints of (19a) and (19b) yields $$R_{21} = N_{13}^1 \bigg/ \left[ \frac{G_3^1 - G_1^1}{G_2^1 - G_1^1}(C_{22}^1 - C_{21}^1) - (C_{23}^1 - C_{21}^1) \right]. \quad (21)$$

The stage 1–2 coefficient-ratio accuracy is improved by again using dither injections in stage 4, and by stirring the three different stage-1 injection to combat 1/f noise in the calibration current sources. Because the stage-1 coefficient is less sensitive to effective the stage-4 step size, only 4 different dither values are used in stage 4 for each stage-1 injected charge. The four different dither injections are 0, 2, 5, and 8 stage-4 injection pulses, with each pulse having a single 1-tic (50 ns) width. The four dither steps span the stage-4 step size so that the average of 4 differently dithered views will yield stage-4 counts with a resolution of ¼ of a step. For accurate results, the stage counts for each stage-3 injected charge are again averaged over an integer number of 4-view "dither cycles".

With stage-1 injections, there is the possibility of channel under-ranging due to an uncorrected positive stage-1 input offset voltage. To prevent under-ranging, a consistent charge is also injected in stage-3. This effectively modifies the inherent offset count for stages 3 and 4 ($N_{3os}$ and $N_{4os}$ in equation (1)) and has no effect on the resulting stage 2-1 coefficient ratio.

The 3-view stirring method has been used with 4 stage-4 dither steps to create a 12-view "stirred-dither" cycle for stage 1–2 ratio measurement. The stage-1 and stage 2–4 counts will satisfy (19a) and (19b) if the stage-1 injection pulse width is $Q_{pulse}^1 = 800$ fC and the three stage-2 injection values are $G_1^1 = 0$, $G_2^1 = 8$, and $G_3^1 = 200$. These were shown in Table 1. Each of the stage counts was separately averaged over 76 stirred-dither cycles and then used in (20). This was repeated a large number of times over several hours and the observed variation of $R_{21}$ was only 20 ppm. This is a very satisfactory amount of variation because $R_{21}$ error has the largest impact at the input charge where a large number of stage-2 folds is about to roll over to a single stage-1 fold. The largest stage-1 input charge where this is true is approximately 10 pC, and the linearity budget is +/−200 ppm (2 fC) for input charge values in this range. See that 20 ppm is much less than the 200 ppm error allowance. Using this method, the stage 1–2 ratio was determined using 76×12=912 views but the number of 12-view stirred-dither cycles can probably be reduced somewhat.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A multi-channel analog to digital conversion circuit comprising:
    a plurality of linearized channels wherein each channel comprises a multi-stage pipelined charge-to-digital converter and an integrating capacitor within each stage of the multi-stage converter, wherein analog residue is processed by subsequent analog to digital converter stages; and
    wherein each stage of respective linearized channels is configured for calculating gain and offset of each respective stage and wherein the gain and offset of a given stage is calculated using a result of a calculated gain and/or offset from an adjacent stage.

2. The multichannel analog to digital conversion circuit of claim 1, wherein each of the integrate and fold amplifier stages comprises:
    an amplifier having an input voltage and output voltage, an inverting terminal connected to the input voltage;
    the integrating capacitor connected between the inverting capacitor connected between the inverting terminal and an output terminal of the amplifier;
    a charge subtracting circuit selectively coupled to the inverting terminal and wherein the charge subtracting circuit is configured for removing a respective predetermined charge a number of times from the integrator capacitor.

3. The multi-channel analog to digital conversion circuit of claim 2, wherein signals outside of a linear operating range of the amplifier are sensed using a comparator and when the signal outside the linear operating range is sensed, the stage is reset.

4. The multichannel analog to digital conversion circuit of claim 3, wherein a threshold voltage is selected to indicate a boundary outside a linear operating range of the amplifier.

5. The multichannel analog to digital conversion circuit of claim 4, further comprising a reset switch responsive to detection of an out of bounds output voltage of the amplifier.

6. The multichannel analog to digital conversion circuit of claim 5, wherein the reset switch closes one when the out of bounds output voltage is detected.

7. The multichannel analog to digital conversion circuit of claim 5, wherein the reset switch closes for a duration when the out of bounds output voltage is detected.

8. The multi-channel analog to digital conversion circuit of claim 1, further comprising a disconnection means for disconnecting a given stage from a prior stage, injecting ratio metric analog signals into the given stage, using the given stage and subsequent stages to determine the calculated gain and offset of the given stage or subsequent stages.

9. The multi-channel analog to digital conversion circuit of claim 1, further comprising a sensor coupled to a first stage of the multi-stage converter, wherein during signal transfer from the sensor to the first stage the sensor is disconnected from the converter to enable increase in stage bandwidth during signal transfer and wherein respective other stages are reconfigured to high stage bandwidth mode while transferring respective analog residue to the subsequent stage.

10. The multi-channel analog to digital conversion circuit of claim 9, wherein the sensor is disconnected from the converter using a switch during a charge removal period and when the sensor is disconnected, a sensor signal is accumulated and stored on the sensor or the sensor signal is accumulated and stored on an external storage element such as a capacitor.

11. The multi-channel analog to digital conversion circuit of claim 10, wherein the sensor is disconnected from the converter when the first stage writes its analog output to a second stage.

12. The multi-channel analog to digital conversion circuit of claim 1, further comprising an over-range prevention circuit used to control the integration of a signal by using a discharge current limiter.

13. The multi-channel analog to digital conversion circuit of claim 12, wherein the over-range prevention circuit is configured for charge removal independent of signal.

14. The multi-channel analog to digital conversion circuit of claim 12, wherein the over range current circuit is disabled to allow the stage to fully process input signal and disconnect input while transferring analog residue.

15. The multi-channel analog to digital conversion circuit of claim 1, further comprising a sensor coupled to a first stage of the multi-stage converter and a monitoring means for monitoring changes in linearization offset and gain in converter by replicating offset and gain drift sources on the monitoring means wherein the monitoring means is uncoupled to the sensor.

16. The multichannel analog to digital conversion circuit of claim 15 wherein the monitoring means further comprises at least one tracker channel coupled to the plurality of linearized channels to monitor changes in gain of the linearized channels by swapping a fold source of a sensor channel with that of the tracker channel.

17. The multichannel analog to digital conversion circuit of claim 16, wherein the current discharge control circuit comprises fold sharing.

18. The multichannel analog to digital conversion circuit of claim 17, wherein the fold current sharing comprises on demand, pre-arranged or grid timesharing.

19. The multi-channel analog to digital conversion circuit of claim 1, further comprising means for measurement and calibration of a fold source using a known, well characterized input signal.

20. The multi-channel analog to digital conversion circuit of claim 1, further comprising a plurality of monitoring circuits coupled to a plurality of multi-stage analog to digital conversion circuits forming a multiple converter configuration, wherein the plurality of monitoring circuits a monitoring means for monitoring changes in linearization offset and gain in the multiple converter configuration.

21. The multi-channel analog to digital conversion circuit of claim 1 wherein each multi-stage pipelined charge-to-digital converter comprises a first stage current-processing integrate and fold amplifier stage coupled in series with three subsequent voltage-processing integrate and fold amplifier stages.

22. The multichannel analog to digital conversion circuit of claim 21, further comprising a tracker channel coupled to then plurality of channels to monitor gain and offset drift of the respective channels and wherein the gain and offset drift are due to temperature, drift across multiple integrated circuits, current leakage or a combination thereof.

23. A method for analog to digital conversion using a multichannel analog to digital conversion circuit and wherein the multichannel analog to digital conversion circuit includes a plurality of linearized channels wherein each channel comprises a multi-stage pipelined charge-to-digital converter and an integrating capacitor within each stage of the four-stage converter, the integrating capacitor storing a charge proportional to an integral of an input charge, the method comprising:
  disconnecting input to a first stage of the multi-stage converter during subsequent stage sampling of an output from the first stage;
  presampling the output from the first stage in subsequent stages;
  disabling of charge removal in the first stage during subsequent stage sampling to avoid sample corruption;
  limiting discharge-current within respective stages using a discharge-current limiter;
  bypassing of the discharge-current limiter at timed intervals to insure all sampled charge is counted by end of each respective integration period;
  disabling of charge removal in a present-stage when bypassing in that stage;
  opening of present-stage bypass and/or discharge switches when sampling by subsequent stages; and,
  disabling of present-stage charge removal prior to and during subsequent stage sampling.

24. A multi-channel analog to digital conversion circuit comprising:
  a plurality of channels, wherein each channel comprises a multi-stage pipelined charge-to-digital converter and an integrating capacitor within each stage of the multi-stage converter, the integrating capacitor storing a charge proportional to an integral of an input charge and wherein each stage of the respective linearized channels is configured for calculating gain and offset for each stage in the channel to be used in subsequent integration periods;
  wherein each of the multi-stage pipelined charge-to-digital converter comprises at least one stage current-processing integrate and fold amplifier stage coupled in series with a plurality of subsequent voltage-processing integrate and fold amplifier stages; and,
  each of the integrate and fold amplifier stages comprises:
  an amplifier having an input voltage and output voltage, an inverting terminal connected to the input voltage;
  the integrating capacitor connected between the inverting capacitor connected between the inverting terminal and an output terminal of the amplifier; and,
  a charge subtracting circuit selectively coupled to the inverting terminal and wherein the charge subtracting circuit is configured for removing a respective predetermined charge a number of times from the integrator capacitor.

* * * * *